US010203164B2

(12) United States Patent
Olsen et al.

(10) Patent No.: US 10,203,164 B2
(45) Date of Patent: Feb. 12, 2019

(54) SOLAR THERMOELECTRICITY VIA ADVANCED LATENT HEAT STORAGE

(71) Applicants: Alliance for Sustainable Energy, LLC, Golden, CO (US); Colorado School of Mines, Golden, CO (US); Nathan P. Siegel, Lewisburg, PA (US)

(72) Inventors: Michele L. Olsen, Arvada, CO (US); Eric S. Toberer, Golden, CO (US); David Samuel Ginley, Evergreen, CO (US); Philip A. Parilla, Lakewood, CO (US); Emily L. Warren, Golden, CO (US); Aaron Daniel Martinez, Arvada, CO (US); Jonathan E. Rea, Lakewood, CO (US); Corey Lee Hardin, Cupertino, CA (US); Christopher J. Oshman, Golden, CO (US); Nathan P. Siegel, Lewisburg, PA (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 267 days.

(21) Appl. No.: 15/290,051

(22) Filed: Oct. 11, 2016

(65) Prior Publication Data
US 2017/0102192 A1 Apr. 13, 2017

Related U.S. Application Data

(60) Provisional application No. 62/315,923, filed on Mar. 31, 2016, provisional application No. 62/240,342, filed on Oct. 12, 2015.

(51) Int. Cl.
*F28D 20/02* (2006.01)
*H01L 35/30* (2006.01)
(Continued)

(52) U.S. Cl.
CPC .............. *F28D 20/021* (2013.01); *F24J 2/07* (2013.01); *F24J 2/34* (2013.01); *F24J 2/4649* (2013.01);
(Continued)

(58) Field of Classification Search
CPC ...... F28D 20/021; F28D 20/028; F28D 15/06; F24J 2/07; F24J 2/34; F24J 2/4649;
(Continued)

(56) References Cited

U.S. PATENT DOCUMENTS 2,350,348 A 6/1944 Gaugler
3,229,759 A 1/1966 Grover
(Continued)

FOREIGN PATENT DOCUMENTS

WO WO 2013/034913 A1 3/2013

OTHER PUBLICATIONS

Andraka et al., "Technical Feasibility of Storage on Large Dish Stirling Systems," Sandia Report SAND2012-8352, printed Sep. 2012, 73 pages.
(Continued)

*Primary Examiner* — Jianying Atkisson
*Assistant Examiner* — Joel Attey
(74) *Attorney, Agent, or Firm* — Michael A. McIntyre

(57) ABSTRACT

An aspect of the present disclosure is a system that includes a thermal valve having a first position and a second position, a heat transfer fluid, and an energy converter where, when in the first position, the thermal valve prevents the transfer of heat from the heat transfer fluid to the energy converter, and when in the second position, the thermal valve allows the transfer of heat from the heat transfer fluid to the energy converter, such that at least a portion of the heat transferred is converted to electricity by the energy converter.

14 Claims, 19 Drawing Sheets

(51) Int. Cl.

| | | |
|---|---|---|
| *F24J 2/07* | (2006.01) | |
| *F24J 2/34* | (2006.01) | |
| *F28D 15/06* | (2006.01) | |
| *F24J 2/46* | (2006.01) | |
| *F24S 80/20* | (2018.01) | |
| *F24S 20/20* | (2018.01) | |
| *F24S 60/00* | (2018.01) | |
| *F28F 13/00* | (2006.01) | |

(52) U.S. Cl.
CPC ............... *F24S 20/20* (2018.05); *F24S 60/00* (2018.05); *F24S 80/20* (2018.05); *F28D 15/06* (2013.01); *F28D 20/028* (2013.01); *H01L 35/30* (2013.01); *F28F 2013/005* (2013.01); *Y02E 10/41* (2013.01); *Y02E 60/145* (2013.01); *Y02E 70/30* (2013.01)

(58) Field of Classification Search
CPC .... H01L 35/30; F28F 2013/005; Y02E 10/41; Y02E 60/145; Y02E 70/30
USPC ......................................................... 165/10
See application file for complete search history.

(56) References Cited

U.S. PATENT DOCUMENTS

| | | |
|---|---|---|
| 4,251,291 A | 2/1981 | Gomez |
| 6,914,343 B2 | 7/2005 | Hiller et al. |
| 8,464,535 B2 | 6/2013 | White et al. |
| 8,618,406 B1 | 12/2013 | Bilak et al. |
| 2004/0118449 A1 | 6/2004 | Murphy et al. |
| 2005/0247356 A1 | 11/2005 | Welle |
| 2008/0156315 A1* | 7/2008 | Yangpichit ................ F03D 1/04 126/698 |
| 2009/0139556 A1 | 6/2009 | Bell et al. |
| 2010/0212656 A1 | 8/2010 | Qiu et al. |
| 2012/0111386 A1 | 5/2012 | Bell et al. |
| 2012/0168111 A1 | 7/2012 | Soukhojak et al. |
| 2012/0192910 A1 | 8/2012 | Fowler et al. |
| 2013/0240068 A1 | 9/2013 | Samara-Rubio et al. |
| 2015/0167648 A1* | 6/2015 | Bergan ................ F28D 20/0056 60/641.15 |

OTHER PUBLICATIONS

Shabgard et al., "Numerical Simulation of Heat Pipe-Assisted Latent Heat Thermal Energy Storage Unit for Dish-Stirling Systems," Journal of Solar Energy Engineering, vol. 136, May 2014, pp. 021025-1-021025-12.

Thayer et al., "Thermal Energy Storage for a Dish Stirling Concentrated Solar Power System," American Institute of Aeronautics and Astronautics, San Jose, CA, Jul. 14-17, 2013, pp. 1-8.

Search Report and Written opinion dated Dec. 19, 2016 from corresponding international patent application No. PCT/US2016/056282.

* cited by examiner

SOLAR THERMOELECTRICITY VIA ADVANCED LATENT HEAT STORAGE

CROSS-REFERENCE TO RELATED APPLICATIONS

This application claims the benefits of U.S. Provisional Application Nos. 62/240,342 and 62/315,923 filed Oct. 12, 2015 and Mar. 31, 2016 respectively, the contents of which are incorporated herein by reference in their entirety.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

The generation of electricity from solar energy has typically been accomplished via two technologies: photovoltaics (PY) and concentrated solar power (CSP). PY modules are highly scalable solid-state devices with few moving parts (e.g. the mechanics associated with tracking the sun). However, because sunlight is directly converted to electricity, intermittent clouds cause variability in power generation. Overcoming these short-term variations, as well as shifting production times from peak sunlight hours (around noon) to peak demand hours (evening), requires the development of energy storage systems that can be incorporated into solar-based energy production systems. The most common solution for PV is costly energy storage batteries. In contrast, CSP offers comparatively low-cost thermal energy storage solutions. However, such CSP thermal energy technologies also require the use of large turbines and the pumping of large quantities of heat transfer fluids, resulting in relatively high operation and maintenance (O&M) costs. Thus, there remains a need for a cost-effective technology that can collect and store energy and easily convert the stored energy to electricity when needed, from solar and other transient energy sources. The present disclosure offers an alternative means of generating electricity from such transient energy sources that has limited moving parts, and is also modular, scalable, and potentially cost effective.

SUMMARY

An aspect of the present disclosure is a system that includes a thermal valve having a first position and a second position, a heat transfer fluid, and an energy converter where, when in the first position, the thermal valve prevents the transfer of heat from the heat transfer fluid to the energy converter, and when in the second position, the thermal valve allows the transfer of heat from the heat transfer fluid to the energy converter, such that at least a portion of the heat transferred is converted to electricity by the energy converter.

In some embodiments of the present disclosure, the system may further include a phase change material (PCM) configured to receive thermal energy, where the PCM may be in thermal communication with the heat transfer fluid, such that when the thermal valve is in the second position, at least a portion of the thermal energy may be transferred from the PCM to the heat transfer fluid. In some embodiments of the present disclosure, the system may further include a receiver configured to receive the thermal energy, such that the PCM may be in thermal communication with the receiver, and the thermal energy may include at least one of solar energy, geothermal energy, and/or energy from industrial sources.

An aspect of the present disclosure is a system that includes a first container having a first internal volume at least partially defined by a wall, a mechanical valve having a closed position and an open position, and a first heat transfer fluid positioned within the first internal volume. When in the closed position, the mechanical valve separates the first internal volume into a first portion and a second portion that includes the wall, such that the first heat transfer fluid cannot be transported between the first portion and to the wall, and when in the open position, the mechanical valve provides a channel that allows the first heat transfer fluid to move from the first portion to the wall such that heat is transferred from the first heat transfer fluid to the wall. In some embodiments of the present disclosure, the first container may include a vertically oriented cylinder and/or a duct. In some embodiments of the present disclosure, the system may further include a wicking structure positioned within the first internal volume of the cylinder.

In some embodiments of the present disclosure, the system may further include an energy converter in thermal communication with the wall such that, when the mechanical valve is in the open position, a portion of the heat transferred from the first heat transfer fluid to the wall may be transferred to the energy converter, which may convert the portion of the heat transferred to electricity. In some embodiments of the present disclosure, the energy converter may include at least one of a thermoelectric generator and/or a heat cycle. In some embodiments of the present disclosure, the heat cycle may include at least one of a Stirling Cycle, a Ranking Cycle, and/or a Brayton Cycle. In some embodiments of the present disclosure, the system may further include a first heat transfer plate positioned between the wall and the energy converter, in thermal communication with both. In some embodiments of the present disclosure, the system may further include a second heat transfer fluid, where the energy converter may include a first surface and a second surface, the first surface may be in thermal communication with the wall, and the second surface may be in thermal communication with the second heat transfer fluid. In some embodiments of the present disclosure, the second heat transfer fluid may include air. In some embodiments of the present disclosure, the air may be at a temperature between about 0° C. and about 100° C. In some embodiments of the present disclosure, the system may further include a plurality of fins physically attached to the second surface of the energy converter.

In some embodiments of the present disclosure, the system may further include a phase change material (PCM) configured to receive thermal energy, where the PCM may be in thermal communication with the heat transfer fluid, and when the mechanical valve is in the open position, at least a portion of the thermal energy may be transferred from the PCM to the first heat transfer fluid. In some embodiments of the present disclosure, the system may further include a receiver configured to receive the thermal energy, where the PCM may be in thermal communication with the receiver, and the thermal energy may include at least one of solar energy, geothermal energy, and/or energy from industrial sources. In some embodiments of the present disclosure, the system may further include a second heat transfer plate positioned between the receiver and the PCM, in thermal communication with both. In some embodiments of the present disclosure, the system may further include a second container having a second internal volume, where the PCM may be positioned within the second internal volume, and the first container may be at least partially immersed in the PCM. In some embodiments of the present disclosure, the first heat transfer fluid may have a boiling point between about 500° C. and about 800° C. In some embodiments of the present disclosure, the boiling point may be at a pressure less than 1 atmosphere. In some embodiments of the present disclosure, the first heat transfer fluid may include at least one of sodium and/or a sodium-potassium eutectic material. In some embodiments of the present disclosure, the sodium-potassium eutectic material may include NaK. In some embodiments of the present disclosure, the PCM may undergo a reversible liquid-to-solid phase transition at a temperature between about 500° C. and about 800° C. In some embodiments of the present disclosure, the PCM may include at least one of aluminum and/or an aluminum alloy.

An aspect of the present disclosure is a method that includes receiving thermal energy from an energy source, transferring the thermal energy to a phase change material (PCM), delivering at least a portion of thermal energy from the PCM to a heat transfer fluid, transferring at least a fraction of the portion of thermal energy from the heat transfer fluid to an energy converter, and converting at least a portion of the fraction of the portion of thermal energy to electricity. In some embodiments of the present disclosure, the method may further include, after the transferring the thermal energy to the PCM, storing the thermal energy in the PCM for a period of time before the delivering.

BRIEF DESCRIPTION OF THE DRAWINGS

Exemplary embodiments are illustrated in referenced figures of the drawings. It is intended that the embodiments and figures disclosed herein are to be considered illustrative rather than limiting.

REFERENCE NUMBERS

Figure 1:
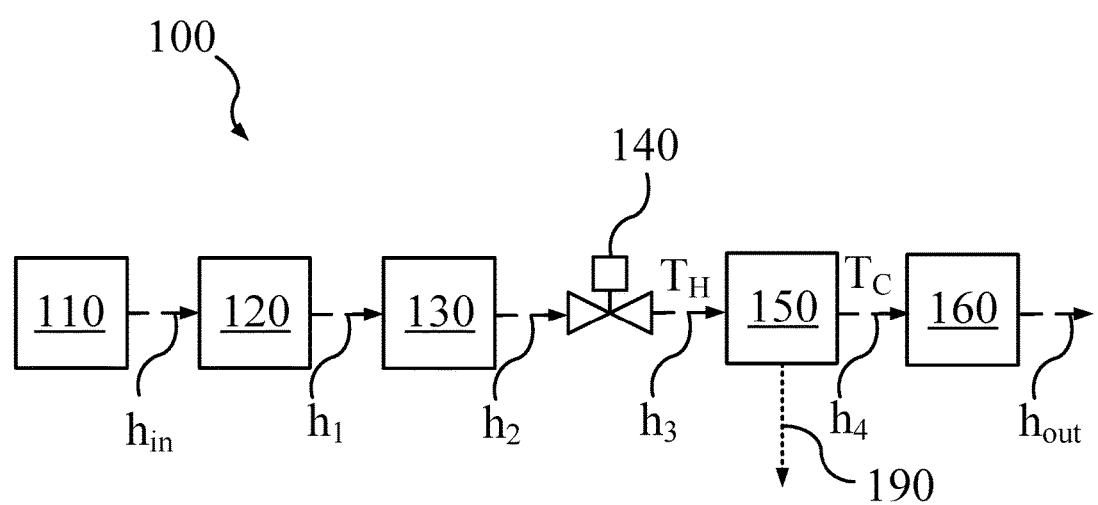
FIG. 1 illustrates a power system, according to some embodiments of the present disclosure.

100 . . . power system
110 . . . energy source
120 . . . receiver
130 . . . thermal storage system
140 . . . thermal valve
150 . . . energy converter
160 . . . heat exchanger
190 . . . electricity
200 . . . aperture
205 . . . light
210, 230 . . . insulation
220 . . . reflecting surface
240 . . . phase change material (PCM)
250 . . . interface
260 . . . empty volume
270 . . . thermoelectric generator (TEG)
280 . . . first heat transfer plate
285 . . . second heat transfer plate
290 . . . heat pipe
295 . . . airflow
300 . . . condensing heat transfer fluid
310 . . . vaporizing heat transfer fluid
400 . . . optics
410 . . . insulating blocks
420 . . . ram
430 . . . insulating blocks
435 . . . thermal cover
440 . . . first fins
450 . . . condensing zone
460 . . . vaporizing zone
500 . . . third heat transfer plate
510 . . . second heat exchanger
520 . . . third heat exchanger
530 . . . pump
540 . . . liquid supply line
550 . . . liquid return line
560 . . . first liquid volume
570 . . . empty volume
580 . . . second liquid volume
600 . . . evaporator
610 . . . condenser
620 . . . first vapor supply line
630 . . . second vapor supply line
640 . . . mechanical valve 650 . . . first fluid volume
660 . . . second fluid volume
670 . . . second tins
700 . . . vessel
710 . . . heat transfer liquid
730 . . . second heat pipes
740 . . . bellows seal
900 . . . tower
910 . . . heliostat
1000 . . . diverter cone
1100 . . . vapor tube
1200 . . . condensate funnel
1300 . . . liquid return tube
1400 . . . method
1410 . . . receiving thermal energy
1420 . . . transferring thermal energy
1430 . . . storing thermal energy
1440 . . . delivering thermal energy
1450 . . . transferring thermal energy
1460 . . . converting thermal energy

DETAILED DESCRIPTION

The present disclosure relates to systems and methods for storing thermal energy for eventual conversion of the thermal energy to electricity. FIG. 1 illustrates a block diagram of a power system configured to receive energy from an energy source (e.g., solar energy from a heliostat field and/or other thermal energy sources), store the energy as thermal energy, and then convert the thermal energy to electricity when needed, either immediately and/or at some later time. The conversion of the stored thermal energy to electricity is accomplished by the use of a "thermal valve", which will be described in detail below, in conjunction with phase change materials (PCM) and an energy converter (e.g. a plurality of thermoelectric generators (TEG) or a Stirling engine)

FIG. 1 illustrates the flow of energy through a power system 100 configured to receive and store energy for the immediate and/or eventual production of electricity 190. In this example, the power system 100 has a receiver 120 configured to receive an influx of energy, $h_{in}$, from an energy source 110. For example, the receiver 120 may be a system or device configured to receive solar energy ($h_{in}$) from a field of heliostats (the energy source 110). Alternatively, the energy source 110 may be other relatively high temperature energy sources, including geothermal sources and/or various industrial sources (e.g. high temperature exhaust streams). In addition, the receiver 120 may be configured to transfer at least a portion of the energy received, $h_{in}$, to a thermal storage system 130, where the energy transferred, $h_1$, may be stored as thermal energy. As will be described below, this stored energy may be stored indefinitely until needed (e.g. evening peak demand) and converted to electricity 190 by an energy converter 150. Or, alternatively, the thermal energy, $h_1$, transferred to the thermal storage system 130 may be converted immediately to electricity 190 by the energy converter 150. In some embodiments, even excess electrical energy (e.g. during periods of low use) may be converted to heat for temporary storage and later converted back to electrical energy (e.g. during peak demand periods). Transfer of energy, $h_2$ and $h_3$, from the thermal storage system 130 to the energy converter 150 is controlled and/or regulated by a thermal valve 140. $h_3$ may be less than or equal to $h_2$, depending on thermal losses to the environment. Examples of energy converters 150 suitable for some embodiments of the present disclosure include various heat engines (heat cycles) and/or TEGs. Examples of heat cycles that may be used in some embodiments of the present disclosure include the Stirling Cycle, the Rankine Cycle, the Brayton Cycle, and/or any other heat cycle.

The process of transferring energy, $h_1$, from the receiver 120 to a thermal storage system 130 is described herein as "charging" the power system 100 with thermal energy. A thermal storage system 130 may have a maximum energy storage capacity and/or a corresponding maximum operating temperature. For example, a thermal storage system 130 may include a fixed mass of a phase change material (not shown in FIG. 1), where the system's energy storage capacity is defined as at least the sum of the sensible heat needed to heat the phase change material (PCM) from a starting temperature to the PCM's melting point, plus the latent heat required to fully melt the entire mass of the PCM. Thus, a power system 100 may be considered to be fully charged when the PCM contained within a thermal storage system 130 has been completely melted, with minimal or no additional energy input to raise the temperature of the PCM above its melting point temperature. In this example, the maximum operating temperature may be defined as the melting temperature of the PCM. In other cases, the PCM may be heated to a temperature higher than its melting point, where the thermal storage system's maximum operating temperature may be higher than the melting point temperature of the PCM. Thus, a thermal storage system 130 may reach maximum operating temperatures ($T_H$) corresponding to temperatures from about 500° C. to about 800° C., depending at least upon the PCM chosen. Examples of phase change materials that may be used in a thermal storage system 130 include aluminum and/or aluminum alloys, and chloride, fluoride, and/or sulfate salts. In some embodiments of the present disclosure, the maximum operating temperature (TH) may be between about 300° C. and about 1000° C.

Due to such relatively high operating temperatures, a thermal storage system 130 may require at least some insulation (not shown) to prevent or minimize energy losses to the environment; e.g. due to conductive, radiant, and/or convective losses. However, a thermal storage system's high operating temperature also enables the efficient use of a heat engine. The upper limit for the conversion of energy by a heat engine is the Carnot efficiency, as defined by Equation A below, where $T_H$ corresponds to a relatively high temperature for the "hot-side" of a heat engine, and $T_C$ corresponds to a relatively low temperature for the "cold-side" of a heat engine. Equation A illustrates that higher temperature differentials, $\Delta T = T_H - T_C$, across the energy converter result in higher conversion efficiencies;

$$\eta = \frac{T_H - T_C}{T_H} \tag{A}$$

Equation A shows that as the ratio of $T_C$ to $T_H$ decreases, a heat engine's efficiency for converting thermal energy to electricity, $\eta$, increases ($\eta$ is also equal to $1-h_4/h_3$). Thus, placing the hot-side (or first side) of a plurality of TEGs or a Stirling engine in thermal communication with a thermal storage system 130 containing a PCM at a relatively high operating temperature (e.g. melting temperature), and placing the cold-side (or second side) of the plurality of TEGs or a Stirling engine in thermal communication with a heat exchanger 160 operated at a relatively low temperature, may result in a high heat flux through the energy converter and high conversion efficiencies by the heat engine (e.g. conversion of thermal heat to electricity).

A heat exchanger 160 may include a conductive material (e.g. solid metal) positioned with a first side in contact with an energy converter 150 (e.g. the cold-side of a TEG or TEG module), and a second side positioned within the flow of a cooling fluid (a heat transfer fluid; not shown). The cooling fluid, for example a low temperature gas, may act as a heat sink for the removal of any heat not converted to electricity by the TEGs. For example, a heat exchanger 160, may be a conductive slab and/or layer (e.g. a solid metal), with a first surface of the conductive layer placed in direct contact with the cold-sides of a bank of TEGs, and a second surface placed within the flow of a relatively colder air stream (not shown). In such examples, a cold air stream may have a bulk temperature from about −20° C. to about 100° C. Thus, the cold-side temperature, $T_C$, of a TEG may be about −20° C. to about 100° C. A heat exchanger 160 may include various features to promote and/or maximize the transfer of energy from the heat exchanger 160 to the cooling fluid; e.g. by maximizing the surface area and/or heat transfer coefficient of the heat exchanger. One example includes increasing a heat exchanger's surface area in contact with a cooling fluid by the use of fins and/or other surface area extensions attached to a conductive layer. Other suitable heat exchanger 160 configurations may be implemented to increase the outside heat transfer coefficient of the heat exchanger 160.

Given the potentially high temperature difference between the hot-side, $T_H$, and the cold-side, $T_C$, of an energy converter 150, the driving force for heat transfer from a thermal storage system 130 to the energy converter 150, and then through the energy converter 150 to a heat exchanger 160, may be relatively high. In some cases, $\Delta T = T_H - T_C$ may be a $\Delta T$ of about 400° C. to a $\Delta T$ of about 800° C. A large $\Delta T$ driving force for heat transfer may be desirable when discharging the thermal energy from the thermal storage system 130 to the energy converter 150. However, for a power system 100 to function as desired, e.g. to collect and/or store energy (e.g. during periods of sunlight) and later generate electricity when needed (e.g. during periods of peak demand in the evenings), a robust and reliable switching mechanism is desirable. Such a switching mechanism should be able to switch between a first mode of charging and/or storing thermal energy, to a second mode of discharging the thermal energy to generate electricity, and back again (reversible), as many times as needed. A thermal valve 140, as described herein, provides this functionality.

FIG. 1 illustrates an example of a thermal valve 140 as a mechanical on/off valve. This is because a thermal valve 140, as described herein, has at least two positions, a first "open" position and a second "closed" position, similar to a simple mechanical valve. In the "closed" position, a thermal valve 140 is configured to thermally isolate the thermal storage system 130 from the energy converter 150 (e.g. TEGs or a Stirling engine). For a system storing thermal energy at relatively high temperatures, a thermal valve 140 in the "closed" position may be configured to minimize conductive, radiant, convective, and/or any other means of heat transfer from the thermal storage system 130 to the energy converter 150. A thermal valve 140 in the "open" position may be configured to maximize conductive, radiant, convective, and/or any other means of heat transfer from the thermal storage system 130 to the energy converter 150. So, although FIG. 1 illustrates a simple mechanical valve as the thermal valve 140, some embodiments of a thermal valve 140 may include various elements and features working together to both retain thermal energy within the thermal storage system 130 (e.g. when charging), and also efficiently transfer this thermal energy to the energy converter 150 when electricity generation is needed (e.g. when discharging). However, in the case where a simple mechanical valve is incorporated into the thermal valve 140, any suitable (e.g. insulated) mechanical valve, including ball valves, gate valves, and/or plug valves may be used.

In summary, referring again to FIG. 1, a power system 100 for receiving and storing energy and converting energy to electricity 190 may include a receiver 120 configured to receive energy, $h_{in}$ from an energy source 110. The receiver 120 may transfer at least a portion of the energy received, $h_1$, to a thermal storage system 130, where it may be stored for later use and/or immediately transferred to an energy converter 150 for the production of electricity 190. The transfer of energy from the thermal storage system 130 to the energy converter 150 is controlled by a thermal valve 140, where the thermal valve 140 has an "open" position that enables the flow of energy, $h_2$ and $h_3$, from the thermal storage system 130 to the energy converter 150, and a "closed" position that prevents the flow of energy, $h_2$ and $h_3$, from the thermal storage system 130 to the energy converter 150. When in the "open" position, energy transfer may be driven by the temperature differential between the thermal storage system 130 at a relatively high operating temperature, and a heat sink (e.g., the external environment) at a relatively low temperature. The transfer of energy to the energy converter 150 may be facilitated by a heat exchanger 160 that maintains an outlet/pathway for any thermal energy not converted to electricity by the energy converter 150. Thus, the heat exchanger 160 may help maintain the cold-side temperature of the energy converter 150, $T_C$, by providing an outlet for energy not converted to electricity 190, such that the non-converted energy, $h_{out}$, may be ejected from the power system 100 to the outside environment (e.g. heat sink) and/or a cooling heat transfer fluid (not shown).

Figure 2:
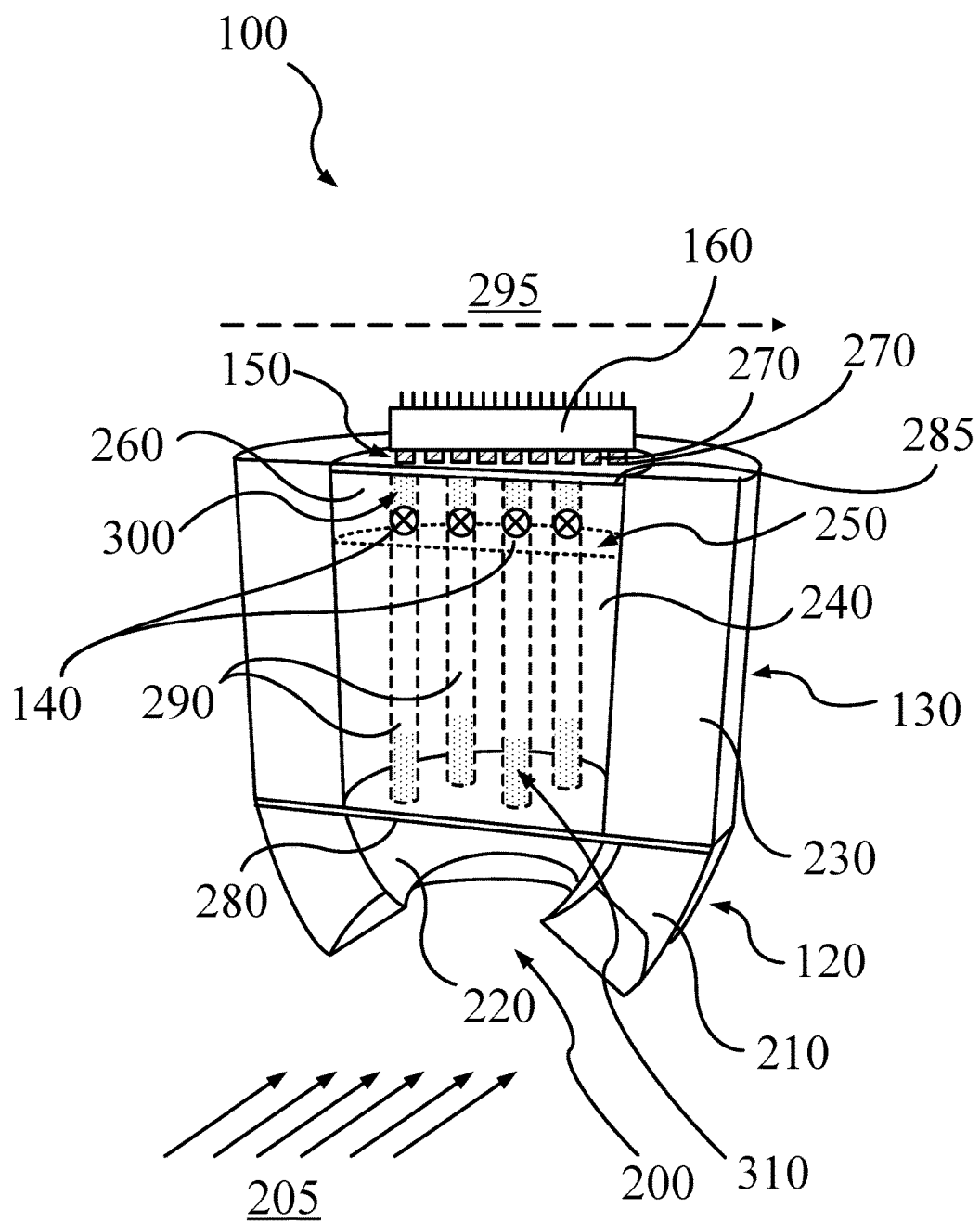
FIG. 2 illustrates a power system utilizing mechanical valves as thermal valves, according to some embodiments of the present disclosure.

FIG. 2 illustrates an example of a power system 100 for receiving and storing thermal energy and for converting stored thermal energy to electricity. In this example, a receiver 120 receives light 205 (e.g. electromagnetic radiation) from a heliostat field and/or any other suitable source (not shown). The receiver 120 may be constructed to include insulation 210 in the shape of a dome with a central aperture 200. The light 205 from the heliostat field may be directed towards the aperture 200 so that at least a portion of the light 205 passes through the aperture 200 to impinge upon a first heat transfer plate 280. Other internal elements of the aperture 200 may have one or more reflecting surfaces 220, to maximize the portion of light 205 that impinges upon the first heat transfer plate 280 and/or to minimize energy losses to the environment. For example, a reflecting surface 220 within the aperture 200 may be configured to maximize the reflection of light 205 in the visible, infrared, and/or ultraviolet wavelengths of the solar spectrum from the inside surfaces of the receiver 120, and/or may be configured to maximize and/or redirect light 205 that has been reflected to the first heat transfer plate 280. The first heat transfer plate 280 may have a surface and/or coating that maximizes the absorbance of light in the visible, infrared, and/or ultraviolet wavelengths of the solar spectrum, to maximize the transfer of energy from the receiver 120 to the thermal storage system 130.

Thus, at least a portion of the light 205 absorbed by the first heat transfer plate 280 may be converted to heat and transferred to the thermal storage system 130. In this example, the thermal storage system 130 includes circular walls made of or encased by insulation or an insulating material 130 and is capped with two heat transfer plates (280 and 285) to form in internal volume. As shown in FIG. 2, this internal volume may be at least partially filled with a phase change material 240. When partially filled with phase change material 240, the phase change material 240 may define an interface 250 (e.g. liquid/gas interface and/or solid/gas interface), which together with the second heat transfer plate 285 defines an empty volume 260 within the thermal storage system 130. Such an empty volume 260 may contain a gas at a pressure ranging from close to full vacuum to several atmospheres of pressure.

The example shown in FIG. 2, shows that a thermal storage system 130 may include a plurality of substantially vertically oriented heat pipes 290, positioned such that a significant portion of the heat pipes' lengths are immersed and/or submerged in the phase change material 240. Further, this example shows a first end of each heat pipe 290 physically attached to the first heat transfer plate 280, and a second end of each heat pipe 290 physically attached to the second heat transfer plate 285, where the second heat transfer plate 285 is in thermal communication with the hot-side of the energy converter 150 (e.g. a TEG module). Each heat pipe 290 may be viewed as a container defined by outside walls, which further define an enclosed, internal space. Although FIG. 2 illustrates these containers in the form of round, cylindrical "pipes", it is to be understood that other three-dimensional shapes and cross-sections are possible for the containers spanning the first heat transfer plate 280 and the second heat transfer plate 285; e.g. triangular, rectangular, square cross-sections of ducts, channels, and/or any other suitable container, etc.

Referring again to the example of FIG. 2, each heat pipe 290 of the thermal storage system 130 contains a heat transfer fluid that undergoes a reversible phase change from liquid-to-gas, within the inside volume of each heat pipe 290. A wicking structure (not shown) may be added to the interior walls of each heat pipe 290 to promote the flow of the heat transfer fluid, in liquid form, along the long-axis dimension of the each heat pipe 290. The boiling point of the heat transfer fluid may occur at a temperature equal to or less than the melting point temperature of the PCM 240. For example, if the PCM 240 melts/freezes at a temperature $T_1$, a heat transfer fluid may be selected for the heat pipes 290 having a boiling-point temperature $T_2$ that is less than or equal to $T_1$. Thus, in some examples, the heat transfer fluid contained within a heat pipe 290 may have a boiling point temperature from about 100° C. to about 800° C., at pressures ranging from about 1 atmosphere or less. Some examples of suitable heat transfer fluids for the heat pipes 290 used include sodium and/or potassium for the upper end of the temperature range, and water, methanol, and naphthalene for lower operating temperatures.

FIG. 2 illustrates a simple embodiment of a thermal valve 140, in the form of an on/off mechanical block valve. In this example, such a thermal valve is positioned to divide its associated heat pipe 290 into a first section, which is substantially in direct contact with (e.g. submerged) the PCM 240, from a second section of heat pipe 290 that is positioned substantially within the empty volume 260 of the thermal storage system 130. As described above, each thermal valve 140, in this case each mechanical valve, has at least two positions. The first position corresponds to an "open" position in which each thermal valve 140 allows substantially unrestricted flow of mass and/or energy between the first section of its corresponding heat pipe and the second section of the heat pipe. Thus, while in the "open" position, each thermal valve 140 allows the flow of heat transfer fluid, as condensate and/or vapor, between the two sections of its corresponding heat pipe 290. The second position corresponds to a "closed" position in which each thermal valve 140 blocks and/or restricts the flow of mass and/or energy between the two sections of its respective heat pipe 290.

As each heat pipe 290 illustrated in FIG. 2 is physically connected to both the first heat transfer plate 280 and the second heat transfer plate 285, each heat pipe 290 is also in thermal communication with both heat plates (280 and 285). Thus, each heat pipe 290 is configured to achieve at least two tasks. First, each heat pipe 290 assists with charging the thermal storage system 130 with thermal energy by enabling the charging process to occur faster and/or by enabling more effective heating of a larger percentage of the PCM's mass. Second, a heat pipe 290 enables the discharge of thermal energy from the thermal storage system 130 to the energy converter 150 to produce electricity when desired. The combination of heat transfer plates (280 and 285) in thermal communication with each heat pipe 290, the PCM 240 in thermal communication with each heat pipe 290, the heat transfer fluid positioned within each heat pipe, and the thermal valves 140 positioned between the high temperature PCM and the energy converter 150 in thermal communication with a relatively low temperature heat sink (e.g. via a heat exchanger 160) function together to enable the on-demand charging and discharging operations of the power system 100.

Referring again to FIG. 2, when charging the thermal storage system 130, with the thermal valves 140 in the "closed" position, at least a portion of the radiant energy from the incoming light 205 may be absorbed as heat by the first heat transfer plate 280 of the receiver 120. A first portion of the resultant heat may be transferred directly to the PCM 240, causing at least a portion of the PCM 240 to heat up and/or melt. A second portion of the heat absorbed may be transferred by the first heat transfer plate 280 to the heat transfer fluid contained within each heat pipe 290, such that at least a portion of the heat transfer fluid heats up and/or vaporizes. During charging there may be significant temperature gradients within the mass of PCM 240 contained within the thermal storage system 130. Thus, vaporized heat transfer fluid may subsequently condense on lower temperature surfaces within the heat pipes 290, for example sections of heat pipe at higher elevations, corresponding to lower temperature PCM 240. As a result, the condensing heat transfer fluid 300 may transfer at least the latent heat of the condensing heat transfer fluid, and possibly some sensible heat, to the lower temperature PCM 240, resulting in a temperature increase to that portion of PCM 240 within the thermal storage system 130. Thus, the repeated vaporization and condensation of the heat transfer fluid within the heat pipes 290 may accelerate the heating of substantially the entire mass of PCM 240 to its melting point temperature, eventually completely melting the entire mass of the PCM 240 to the fully charged state for the thermal storage system 130.

FIG. 2 illustrates the vaporizing heat transfer fluid 310 at the lower end of each heat pipe 290. However, the heat transfer fluid may vaporize at any position along the vertical axis of the heat pipes 290; e.g. vaporization of the heat transfer fluid may occur within a heat pipe at any surface that is at a temperature higher than or equal to the boiling point temperature of the heat transfer fluid, FIG. 2 illustrates the heat transfer fluid condensing at the upper end of each heat pipe 290. However, the heat transfer fluid may condense at any position along the vertical axis of the heat pipes 290; e.g. condensation may occur within a heat pipe 290 at any surface that is at a temperature lower than or equal to the dew point temperature of the heat transfer fluid.

Referring to FIG. 2, when discharging thermal energy from the thermal storage system 130 to the energy converter 150, the heat pipes 290, thermal valves 140, and related elements (e.g. PCM, heat transfer fluid, heat transfer plates, etc.) also function together. With the thermal valves 140 in the "open" position, vaporized heat transfer fluid may physically access the second heat transfer plate 285 from the hotter zones in the heat pipes 290, below the thermal valves 140. The second heat transfer plate 285, as shown in FIG. 2, may be configured to be in thermal communication with the energy converter 150, which may be in further thermal communication with the heat exchanger 160. The heat exchanger 160 may provide an outlet for unconverted thermal energy to the external environment, and thus, at least partially maintain the high differential temperature that allows the stored energy to be transferred from the thermal storage system 130 to the energy converter 150. As shown in FIG. 2, a heat exchanger 160 may include a first surface in contact with the energy converter 150 (e.g. the cold-side of a TEG module) and a second surface in contact with an airflow 295. The airflow 295 may act as a heat transfer fluid and/or a heat sink to remove heat not converted to electricity by the energy converter 150. This may help maintain a low temperature, $T_C$, at the cold-sides of the TEGs, and thus, maintain the relatively high differential temperature useful for the efficient transfer of thermal energy stored in the thermal energy storage system 130 to the energy converter 150 (e.g TEG module). In the example of FIG. 2, the energy converter 150 is shown to be a plurality of TEG modules 270, but it is to be understood that the TEGs could be replaced by another energy converter, such as a Stirling engine.

Thus, discharging the energy stored in the thermal storage system 130 of FIG. 2 will typically begin with switching the thermal valve(s) 140 from the "closed" position to the "open" position. In the "open" position, mass transfer of the heat transfer fluid may occur between the first portion of each heat pipe and the second portion of each heat pipe. This provides an open channel within each heat pipe 290, which allows for fluid communication between the high temperature zones of each pipe, the heat pipe zones submerged in the PCM 240 at high temperatures, and the low temperature heat pipe zones in thermal communication with the second heat transfer plate 285. This configuration enables the heat transfer fluid, contained within the heat pipes 290, to vaporize in the high temperature zones (vaporization zones), travel through the open thermal valves 140 and condense in the low temperature zones (condensing zones) on surfaces of the second heat transfer plate 285. As a result, at least the latent heat of vaporization, and possibly some of the sensible heat of the heat transfer fluid, may be transferred from the PCM 240 in the thermal storage system 130 to the second heat transfer plate 285. This process may occur continuously until all of the stored energy is transferred from the thermal storage system 130 to the second heat transfer plate 285 and to the energy converter 150 to continuously produce electricity; e.g. until substantially all of the PCM 240 solidifies. In other words, the heat transfer fluid may continue to discharge the thermal energy stored in the thermal storage system 130, by repeated vaporization and condensing, until the temperature of the PCM 240 drops below the boiling point temperature of the heat transfer fluid (for the operating pressure in the heat pipes). Note that while this simple embodiment of a thermal valve 140 can be used to prevent heat flow to the energy converter 150 from a "cold start" (i.e.

the condition in which all of the heat transfer fluid is pooled at the bottom of the pipe in liquid form) and shift the time of electricity production, may not be used to stop the discharge of energy in the system once it has begun. Closing the mechanical valve during discharge may trap some fraction of the heat transfer fluid in the each of the two sections of the pipe, both of which could then continue to transfer heat through their respective sections.

Referring again to FIG. 2, the second heat transfer plate 285 may be at a temperature sufficiently low for the heat transfer fluid to condense on its surface. Condensation of the heat transfer fluid may then create a vacuum that may facilitate further vaporization of the heat transfer fluid. In addition, the surfaces of the second heat transfer plate 285 upon which condensation occurs may be only marginally lower in temperature than the temperature of the PCM 240. Depending on the design, the differential temperature of the PCM 240 melting temperature relative to the operating temperature of the condensing surface of the second heat transfer plate 285 may be a ΔT of about 1° C. to a ΔT of about 30° C. Thus, the second heat transfer plate 285 may provide a hot-side temperature for the energy converter 150, $T_H$ (see FIG. 1), where $T_H$ may be very close to the melting temperature of the PCM 240. As shown in FIG. 2, a heat exchanger 160 may be placed in thermal communication with the energy converter 150 to provide a cold-side temperature, $T_C$ (see FIG. 1), that is significantly lower than $T_H$. The resultant large differential temperature $\Delta T=T_H-T_C$, may enable the energy converter 150 (e.g. TEGs 270) to convert a significant fraction of the heat transferred from the second heat transfer plate to the energy converter 150 to electricity (see Equation A above).

FIG. 2 illustrates that a heat exchanger 160, in thermal communication with the cold-side of an energy converter 150, may include a plurality of fins positioned within an airflow 295 (heat transfer fluid), where the airflow 295 acts as a heat sink for the removal of any unconverted thermal energy from the power system 100. The fins may increase the surface area of the heat exchanger 160 that is in contact with the airflow 295, thus increasing the heat transfer rate from the heat exchanger 160 to the airflow 295.

In some embodiments of the present disclosure, a thermal valve may have one or more positions in addition to the "open" and "closed" positions. These other positions may be intermediate between the two extremes of "open" and "closed" and may be desirable, for example, to control the flow of mass and/or energy between the sections of a heat pipe. Control of the flow of the heat transfer fluid may be desirable, for example, to control the electricity production rate and/or to avoid thermally shocking an energy convener that is at a relatively cold temperature by suddenly contacting the energy converter with the relatively hot heat transfer fluid. In other words, a thermal valve may have intermediate positions between "open" and "closed" to be able to affect the rate of charging and/or discharging the thermal storage system of a power system. The concept of a thermal valve having more than two positions is applicable for the simple mechanical valve configuration illustrated in FIG. 2, as well as for at least some of the more complicated thermal valve embodiments described below.

Figure 3A:
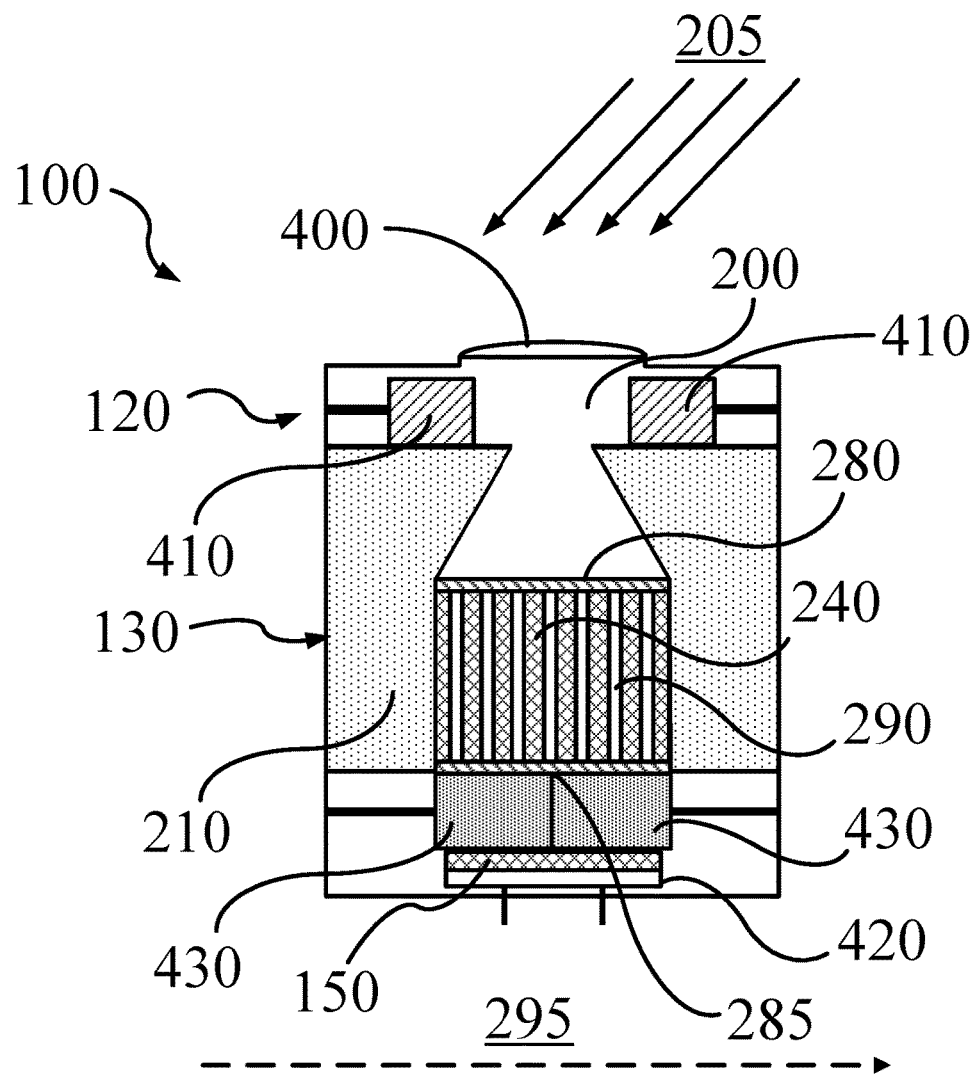
FIGS. 3a and 3b illustrate a power system utilizing, among other things, insulating blocks as a thermal valve, according to some embodiments of the present disclosure.
Figure 3B:
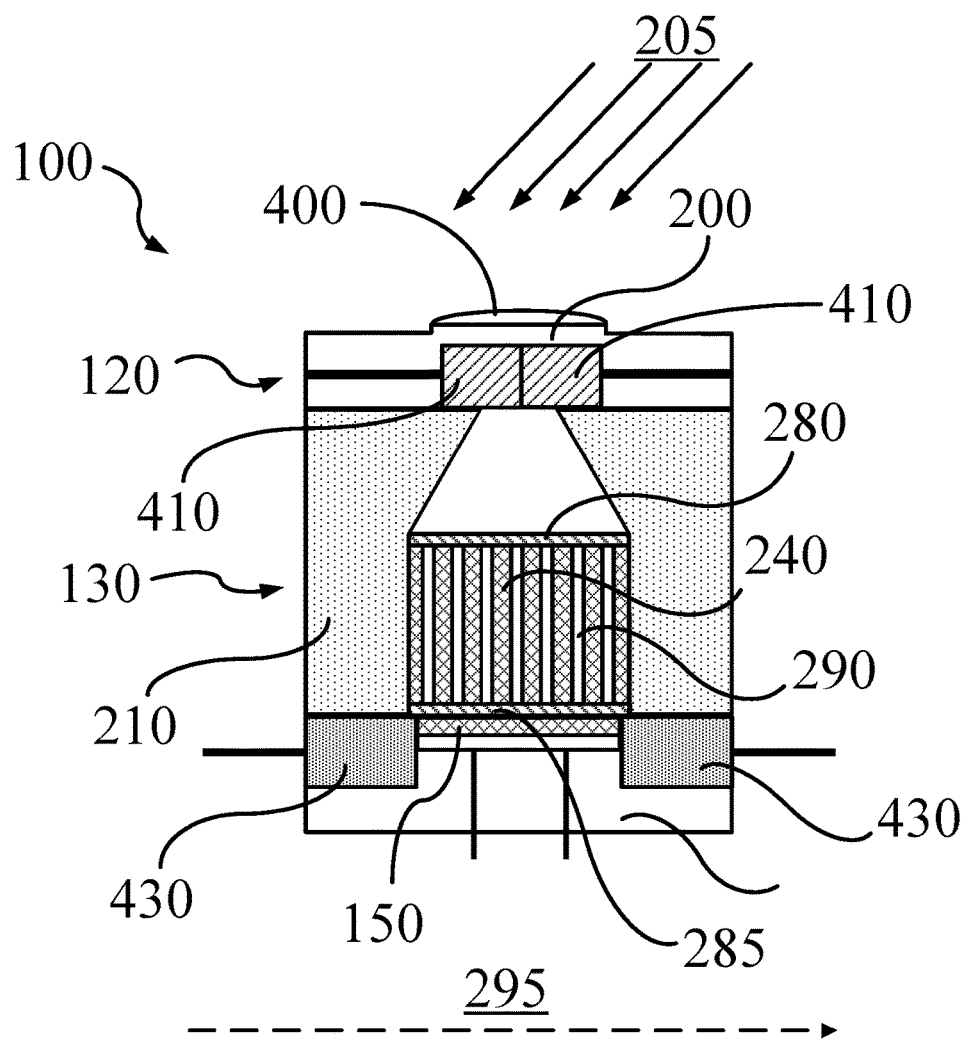

FIGS. 3a and 3b illustrate another embodiment of a power system 100 for collecting and storing thermal energy (FIG. 3a), and convening on-demand at least a portion of the stored thermal energy to electricity (FIG. 3b). The example of FIGS. 3a and 3b is inverted relative to the example of FIG. 2, in that the energy received, light 205, is shown entering a receiver 120 at the top of the receiver 120 instead of at the bottom. However, it should be noted that the power system 100 of FIGS. 3a and 3b may be oriented as needed for a particular application, for example, with the receiver 120 positioned at the top of a power system 100, at the bottom, or tilted with respect to horizontal.

In addition, another notable difference for the example of FIGS. 3a an 3b is that the thermal storage system is essentially filled with PCM 240, with heat pipes 290 positioned essentially completely submerged in the PCM 240. Unlike the thermal storage system 130 of FIG. 2, the power system 100 of FIGS. 3a and 3b does not contain any significant empty volume within the thermal storage system 130, except possibly to accommodate volumetric changes upon freezing and melting. Instead, in this embodiment, the thermal storage system 130 has an internal volume that is essentially entirely filled by PCM 240, with a plurality of heat pipes 290 positioned vertically within the PCM 240. The internal volume of the thermal storage system 130 is bounded by vertical walls (defining any desirable cross-section shape; e.g. circular, square, or any other suitable shape), a first heat transfer plate 280, and a second heat transfer plate 285.

The thermal storage system's internal volume, as shown in FIGS. 3a and 3b, may be filled with a phase change material 340 partly because the thermal valve for the embodiment shown in FIGS. 3a and 3b are different from those shown in FIG. 2. Notably, each heat pipe 290 in the power system 100 of FIGS. 3a and 3b does not have a mechanical valve configured to separate and/or isolate each heat pipe into sections. Instead, each heat pipe 290 extends uninterrupted from the first heat transfer plate 280, through the PCM 240, to the lower positioned second heat transfer plate 285. This configuration is different because the thermal valve of the power system of FIGS. 3a and 3b includes different physical elements that function differently to switch between a "closed" position for charging (FIG. 3a), and an "open" position for discharging (FIG. 3b).

FIG. 3a illustrates the power system 100 during charging and the configuration of the various elements defining the thermal valve when in the "closed" position. As stated above, charging refers to the process of receiving energy from an energy source and storing it within the power system's thermal storage system 130. The power system 100 of FIGS. 3a and 3b utilizes a receiver 120 configured with optics 400 to help concentrate and/or focus incoming light 205 into the receiver 120. The received light 205 may then pass through an aperture 200 and to impinge upon a first heat transfer plate 280 where at least a portion of the light's energy may be converted to heat, which may then be transferred to the thermal storage system 130. The aperture 200 may also contain at least a pair of reversibly movable insulating blocks 410, which when the power system is charging, as shown in FIG. 3a, are in a retracted position to avoid blocking the incoming light 205.

As described for the power system illustrated in FIG. 2, each heat pipe 290 in the power system 100 of FIGS. 3a and 3b has an internal volume containing a heat transfer fluid (not shown). Thus, during charging, a first portion of the heat received by the first heat transfer plate 280 may be transferred directly to the PCM 240, and a second portion of the heat received by the first heat transfer plate 280 may be transferred to the heat transfer fluid contained in the heat pipes 290. Once the temperature of the heat pipes 290 reaches the boiling point temperature of the heat transfer fluid, the heat transfer fluid will begin to evaporate and condense within the heat pipes 290. The repeated vaporization and condensation of the heat transfer fluid within the heat pipes 290 will assist with raising and/or melting substantially all of the PCM 240.

As described above, this direct transfer of heat into the PCM 240, combined with heat transfer by the heat transfer fluid, combine to charge the thermal storage system 130 with thermal energy. This thermal energy may be retained within the thermal storage system 130 by thermally isolating thermal storage system 130 from its external environment. This is partly accomplished by insulating the external surfaces of the thermal storage system 130 with insulation 210. However, additional components of the thermal valve are also important, including a pair of movable insulating blocks 430. When the thermal valve is in the "closed" position (as shown in FIG. 3a) for charging the power system 100, these insulating blocks 430 are extended and in contact with one another to thermally isolate the thermal storage system 130 from the energy converter 150 (e.g. a TEG module). Thus, the thermal energy may be retained within the thermal storage system 130, to continue the charging process and/or to More the thermal energy for later use. In addition to the insulating blocks 430, the "closed" position of this example of a thermal valve may also include physically removing the energy converter 150 (e.g. TEG module) from thermal and/or physical contact with the second heat transfer plate 285. As shown in FIG. 3a, removal of the energy converter 150 from the second heat transfer plate 285 may be accomplished by physically attaching a movable energy converter 150 to a ram 420. Thus, when charging the power system 100, the ram 420 and the energy converter 150 (e.g. TEG module) may be in a retracted position, where there is not thermal/physical contact between the energy converter 150 and the relatively high temperature second heat transfer plate 285.

In summary, when the power system 100 of FIG. 3a is charging, heat may be added to the system and the thermal valve is in a "closed" position, such that:
1. Light 205 passes through the aperture 200 of a receiver 120, unimpeded by insulating blocks 410, which are in a retracted position; and
2. The energy converter 150 (e.g. a TEG module) is in a retracted position and thermally isolated from the thermal storage system 130 by insulating blocks 430 that are in an extended position and physically separate the thermal storage system 130 from the energy converter 150.

FIG. 3b illustrates the relationship of this example power system's elements, when discharging the thermal energy stored in the thermal storage system 130 to the energy converter 150 (e.g. TEG module) for the production of electricity. First, the insulating blocks 410 are placed in an extended position to close off the aperture 220, which among other things, prevents heat from escaping from the receiver 120. This minimizes heat losses, for example convective and/or radiant losses, from the thermal storage system 130 to a potentially significantly cooler outside environment (e.g. the night sky; not shown). Note: The insulating blocks 410 may also be incorporated into the design of FIG. 2 to minimize heat losses.

Discharging the energy from the power system 100 illustrated in FIG. 3b is initiated by retracting the insulating blocks 430 to allow the ram 420 to extend the energy converter 150 (e.g. TEG module) into a position where the energy converter 150 is in physical and/or thermal contact with the second heat transfer plate 285. In addition, retracting the insulating blocks 430 allows the cold-side surfaces of TEGs to be in thermal communication with a cooling airflow 295, thus providing an open path from the second heat transfer plate 285 to the airflow 29:5 for the transfer of non-converted thermal energy to the external environment. This in turn enables TEGs to maintain a low cold-side operating temperature, $T_C$, enabling the power system 100 to efficiently convert the stored thermal energy to electricity.

In summary, when the power system 100 of FIG. 3b is discharging, the storage system is thermally insulated against heat losses and the thermal valve is in an "open" position, such that:
1. insulating blocks 410 are in an extended position and cover the aperture 200, preventing thermal losses from the power system 100 through the aperture 200;
2. Insulating blocks 430 are retracted, allowing physical access by the energy converter 150 to the second heat transfer plate 285;
3. The energy converter 150 (e.g. TEG module) is extended into physical and/or thermal contact with the second heat transfer plate 285 by pushing the energy converter 150 into place using a ram 420.

A third configuration may allow for simultaneous charging and discharging. Thermal energy enters the power system 100 in the form of light 205 while at the same time thermal energy is converted to electricity by the energy converter 150. In this configuration:
1. Light 205 passes through the aperture 200 of a receiver 120, unimpeded by insulating blocks 410, which are in a retracted position; and
2. Insulating blocks 430 are retracted, allowing physical access by the energy converter 150 to the second heat transfer plate 285;
3. The energy converter 150 (e.g. TEG module) is extended into physical and/or thermal contact with the second heat transfer plate 285 by pushing the energy converter 150 into place using a ram 420.

The three configurations of charging, discharging, and simultaneous charging and discharging allow for fill control of the heat flow in the system, thus allowing electricity generation to be turned on and off at will.

Figure 4A:
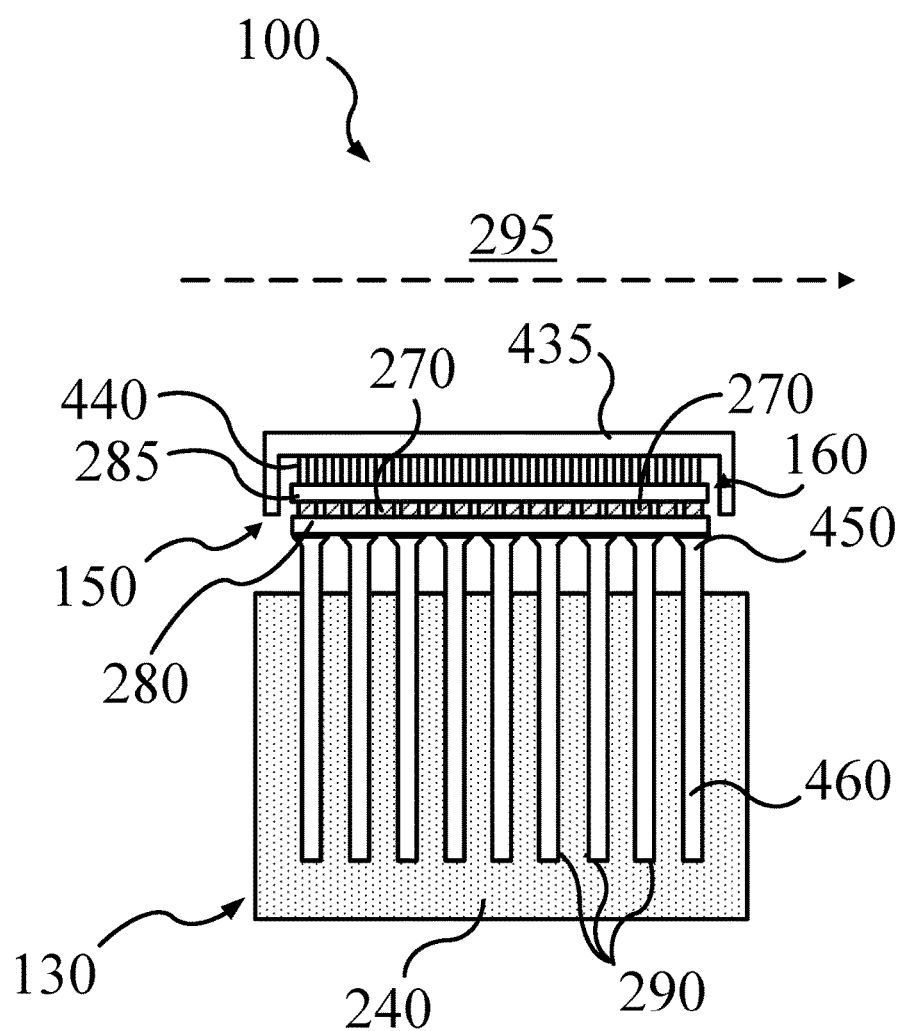
FIGS. 4a and 4b illustrate a power system utilizing a thermal cover as a thermal valve, according to some embodiments of the present disclosure.
Figure 4B:
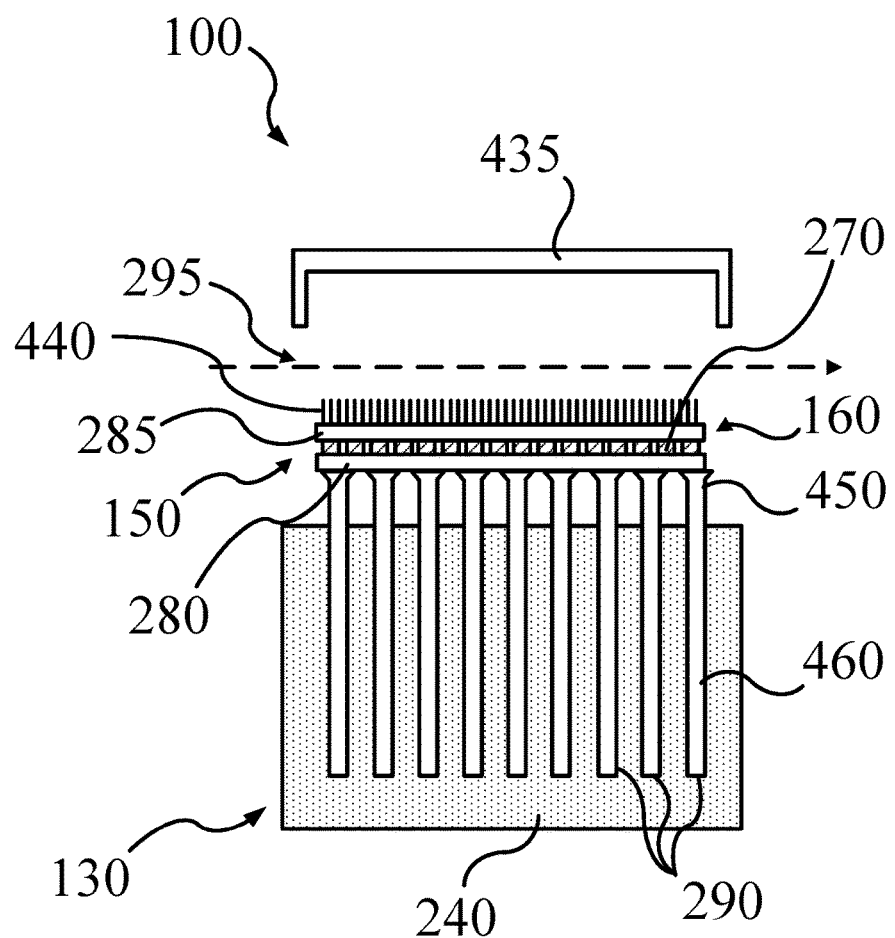

FIGS. 4a and 4b illustrate another embodiment of a power system 100. Note that the receiver is not shown in FIGS. 4a and 4b. However, embodiments of receivers described previously may be implemented into the power system 100 shown in FIGS. 4a and 4b. In the example shown in FIGS. 4a and 4b, a thermal valve includes a thermal cover 435, which, when the thermal valve is in a "charging" or "closed" position as shown in FIG. 4a, provides an insulating thermal barrier that interrupts the flow of thermal energy from the cold-side surfaces of the TEGs 270 (the energy converter 150) to the external environment (e.g, and airflow 295). Thus, the thermal cover 435 interrupts the path for energy transfer through the power system (see FIG. 1). As a result, the heat exchanger 160, the energy converter 150 (e.g. TEG module), and/or the thermal storage system 130 may eventually attain a thermal/temperature equilibrium where the hot-side temperature, $T_H$, of the TEGs 270 approaches and/or is equal to the cold-side temperature $T_C$. Referring to Equation A above, when $T_H$ equals $T_C$, the TEG conversion efficiency, η, is zero, and none or minimal amounts of the thermal energy stored in the power system 100 may be converted to electricity. Since the thermal cover 435 retains the thermal energy (e.g. heat) in the power system 100, the end-effect is retention of the stored thermal energy within the thermal storage system 130.

Thus, when the thermal valve of FIG. 4a is in the "closed" position (e.g. while charging the power system 100), the thermal cover 435 covers, surrounds, and/or insulates the heat exchanger 160 and/or the energy converter 150 (e.g. TEGs), isolating these elements from the surrounding environment (e.g. airflow 295), retaining the thermal energy stored in the power system 100. When the thermal valve of FIG. 4b is in the "open" position (e.g. while discharging the power system 100), the thermal cover 435 may be positioned away from the heat exchanger 160 and/or the energy converter 150, providing a pathway for thermal energy to flow to the surrounding environment (e.g. airflow 295). Thus, the thermal heat may be transferred to the environment, a relatively low $T_C$ may develop at the cold-sides of an energy converter 150 using TEGs, thermal energy may be converted to electricity, and the power system 100 may discharge.

FIG. 4b shows the arrangement of the thermal cover 435 when discharging the power system 100. When discharging, the thermal cover 435 may be removed from the rest of the power system 100, such that it no longer provides a barrier to heat transfer from the power system 100 to the external environment (e.g. the airflow 295). Thus, when discharging, a relatively low temperature airflow 295 may contact the heat exchanger 160. As a result, the heat exchanger 160 and the energy converter 150 (e.g. TEG module), which were previously at thermal equilibrium (e.g, at about $T_H$) with the thermal storage system 130, may begin to cool and drop in temperature. As a result of this cooling, the cold-side surfaces of the TEGs 270 may also cool and gradually attain a steady-state cold-side temperature, $T_C$. Thus, a high differential temperature may be established across the TEG module, and efficient conversion of thermal energy to electricity commences. Maintaining a low $T_C$ and a high thermal energy to electricity conversion efficiency may be attained by increasing the heat transfer rate of the heat exchanger 160 by increasing the heat exchanger's outside surface area by the use of a first set of fins 440.

The thermal storage system 130 of FIGS. 4a and 4b utilize aspects of the systems shown in FIGS. 2, 3a, and 3b. First, a plurality of heat pipes 290 is vertically positioned within the thermal storage system 130. And, as in FIG. 2, a first section of each heat pipe 290 is submerged and in direct physical contact with a PCM 240, and a second portion of each heat pipe 290 extends out of the PCM 240 into an empty volume defined by a PCM/gas interface layer and a first heat transfer plate 280. As in the previous examples, each heat pipe 290 has an internal volume containing a heat transfer fluid (not shown) But unlike the example of FIG. 2, the heat pipes 290 of the example power system 100 shown in FIGS. 4a and 4b are not divided into sections by mechanical valves. Instead, similar to FIGS. 3a and 3b, each heat pipe 290 is a straight, uninterrupted length of pipe. However, the example of FIGS. 4a and 4b is unique in that a first end of each heat pipe 290 terminates in a plugged, free-floating end that is suspended within the PCM 240. A second end of each heat pipe 290 terminates at, and is in physical and thermal communication with, the first heat transfer plate 280.

However, the heat pipes 290 illustrated in FIGS. 4a and 4b function essentially in the same manner as previously described for the examples shown in FIGS. 2, 3a, and 3b. Thus, when the power system 100 illustrated in FIG. 4a is charging, heat may be transferred from the receiver (not shown) to the PCM 240. As the PCM 240 heats up and/or melts, thermal energy may be transferred to the heat transfer fluid contained within the heat pipes 290. Once the heat transfer fluid attains its boiling point temperature, the heat transfer fluid may begin the cycle of vaporizing and condensing, as described above, and assist with the quicker and/or more complete charging of the power system 100. Eventually, substantially all of the PCM 240 may melt, which in some embodiments of the power systems described herein represents a fully charged power system 100. With the thermal cover 435 in place, the power system 100 is insulated from the external environment. Thus, additional thermal input into the power system 100 may result in further temperature rises above the target operating temperature, until all of the inside surfaces of the heat pipes 290 reach temperatures above the heat transfer fluids dew point. As a result, condensation of the heat transfer fluid within the heat pipes ceases, and eventually a steady-state mixture of saturated heat transfer fluid liquid and vapor may be attained.

Discharging the power system 100 by removal of the thermal cover 435, allowing cooling to occur of the cold-side surfaces of the TEGs, restarts the vaporization/condensation cycle of the heat transfer fluid. As the heat exchanger 160 transfers thermal energy from the power system to the surrounding environment (e.g. airflow 295), the heat exchanger 160 and energy converter 150 cool and their operating temperatures drop. As a result, the heat pipes 290 also cool, and some of the heat pipes' inside surface cool to the dew point temperature of the heat transfer fluid, As a result, portions of the heat transfer fluid begin to condense and heat transfer of latent heat to the first heat transfer plate 280 begins and the cycle of condensing and vaporizing the heat transfer fluid within the heat pipes 290 is resumed. This repeated vaporization and condensation of the heat transfer fluid will occur continuously, as described above, until all the surface of the heat pipes 290 attain temperatures below the boiling point temperature of heat transfer fluid. This may be when substantially all of the PCM 240 has solidified and dropped to operating temperatures below the boiling point temperature of the heat transfer fluid.

As in the embodiment of FIGS. 3a and 3b, the configuration shown in FIGS. 4a and 4b allows for simultaneous charging and discharging by removing the insulating cover while heat is input into the system. It also allows for stopping or pausing discharging before the PCM 240 is fully solidified by replacing the cover.

Referring again to FIGS. 4a and 4b, vaporizing zones 460 are indicated as occurring in sections of the heat pipes 290 that are submerged within the PCM 240. Condensing zones 450 are indicated as occurring in sections of heat pipes 290 that are positioned within the empty volume of the thermal storage system 130. However, as described above, it is to be understood that vaporization may occur in any section of heat pipe that has an operating temperature equal to or larger than the heat transfer fluid's boiling point temperature. Similarly, condensation may occur in any section of heat pipe that has an operating temperature equal to or less than the heat transfer fluid's dew point temperature. Finally, FIGS. 4a and 4b also illustrates an embodiment where a TEG module may be sandwiched between the first heat transfer plate 280, and a second heat transfer plate 285. The first heat transfer plate 280 may be in thermal communication with condensing zones 450 of the heat pipes, and also in thermal communication with the hot-side (at $T_H$; see FIG. 1) of each TEG 270. The second heat transfer plate 285 may be a component of the heat exchanger 160, and may be in thermal communication with the cold-side (at $T_C$) of each TEG 270. A first set of fins 440, may be physically attached to the second heat transfer plate 285 to improve heat transfer from the heat exchanger 160 to the airflow 295, thus maintaining a low $T_C$.

Figure 5:
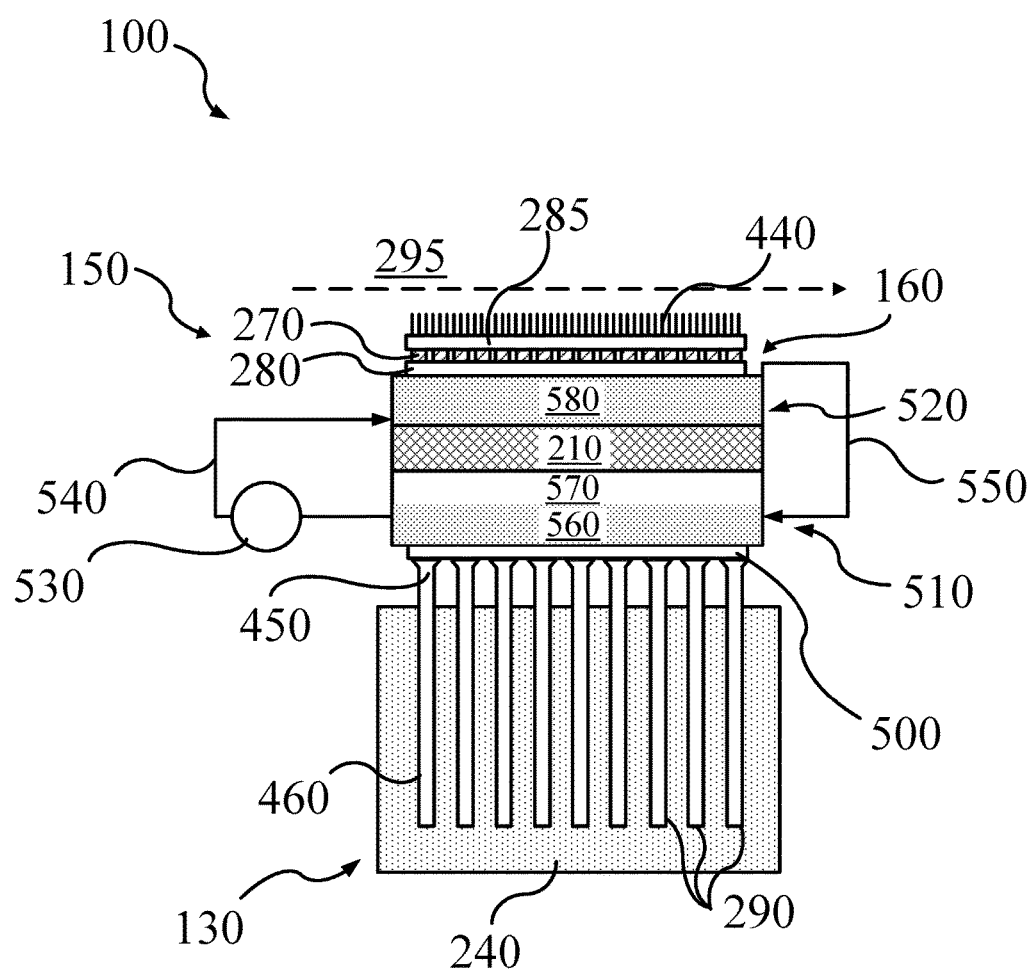
FIG. 5 illustrates a power system utilizing, among other things, a circulating heat transfer liquid between two heat exchangers as a thermal valve, according to some embodiments of the present disclosure.

FIG. 5 illustrates another embodiment of a power system 100. The thermal storage system 130 (e.g. the PCM 240, heat pipes 290, heat transfer fluid, etc.) may be substantially similar to the thermal storage systems described previously. The same is true for the heat exchanger 160 (e.g. the first heat transfer plate 280, the second heat transfer plate 285, the energy converter 150, the first set of fins 440 and their relationship to an airflow 295, etc.) So, additional detailed description of these elements and features are not repeated here. While the energy converter 150 is shown to be a plurality of TEG modules 270, it is to be understood that the TEGs could be replaced by another energy converter, such as a Stirling engine. Instead, a detailed description is provided of an alternative embodiment for a thermal valve for on-demand switching between "charging" and "discharging" states.

FIG. 5 illustrates a power system 100 having thermal valve that has a number of elements working in cooperation together. As in the previous embodiment of thermal valves describe above, the example illustrated in FIG. 5 also has at least two positions, a first "closed" position for charging the power system 100, and a second "open" position for discharging the power system to produce electricity. The power system 100 may be switched between the positions, as needed, through the use of a heat transfer liquid. This heat transfer liquid is separate and distinct from the heat transfer fluid contained in the heat pipes 290.

The thermal valve of FIG. 5 includes a number of elements and features, including a second heat exchanger 510 in thermal communication with the heat pipes 290, (Note that heat exchanger 160 may also be referred to in this example as the "first" heat exchanger, and this is why the new exchangers unique to this example are referred to as "second" and "third".) This thermal communication may be established by sandwiching a third heat transfer plate 500 between the heat pipes 290 and the second heat exchanger 510. The thermal valve may also include a third heat exchanger 520 in thermal communication with a first heat transfer plate 280 that may be in contact with the hot side of an energy converter 150, which in this example is illustrated as a plurality of TEGs 270. The second and third heat exchangers (510 and 520) may be configured to be in liquid communication with each other. The two heat exchangers may be in liquid communication due to a liquid supply line 540 linking them together (e.g. a pipe or other conduit). A pump 530 may be positioned in the liquid supply line 540. The second and third heat exchangers (510 and 520) may also be in fluid communication due to the implementation of a liquid return line 550 (e.g. a pipe or other conduit).

The example of a thermal valve shown in FIG. 5 may also include a heat transfer liquid, which may be contained within the second heat exchanger 510 and the third heat exchanger 520, within a first liquid volume 560 and second liquid volume 580, which may be physically separated from each other by insulation 210. These elements function together to yield a switchable thermal valve that may be switched, on-demand, between an "open" position (for discharging and/or converting thermal energy to electricity) and a "closed" position (for charging the power system 100 with thermal energy)

For example, when charging the power system 100 of FIG. 5, the pump 530 is "off" and not circulating heat transfer liquid from the second heat exchanger 510 to the third heat exchanger 520, through the liquid supply line 540 and liquid return line 550. Thus, this lack of liquid flow prevents or minimizes the transfer of thermal energy from the thermal storage system 130 to the energy converter 150 because the second heat exchanger 510 remains thermally isolated from the third heat exchanger, at least partly due to separating layer of insulation 210. The insulation 210 positioned between the second heat exchanger 510 and the third heat exchanger 520 minimizes and/or eliminates heat transfer between these two heat exchangers by blocking radiation, convective, and/or conductive losses between the second heat exchanger 510 and the third heat exchanger 520. In addition, the liquid supply line 540 and the liquid return line 550 may both be configured such that they transfer only minimal or zero amounts of energy between the second heat exchanger 510 and the third heat exchanger 520. For example, draining the heat transfer liquid from the second liquid volume 580 to the first liquid volume 560 may remove the heat transfer liquid from the liquid supply line 540 and the liquid return line 550 such that both lines are substantially empty. These empty pipes (or other suitable conduit), combined with an empty second liquid volume 580, may provide a large enough resistance to heat transfer, that heat transfer from the second heat exchanger 510 to the third heat exchanger 520 is reduced or eliminated. FIG. 5 also illustrates that the second heat exchanger 510 may have an internal volume that is larger than the actual volume needed to completely drain all of the heat transfer liquid from the third heat exchanger 520 to the second heat exchanger 510 while still maintaining an empty volume 570 within the second heat exchanger 510.

Thus, in the absence of heat transfer liquid flow between the second heat exchanger and the third heat exchanger, and energy entering the thermal storage system, is isolated from the energy converter 150 and the external environment (e.g. airflow 295) and thermal energy is retained in the thermal storage system 130.

When discharging the thermal energy from the power system 100 to produce electricity, the pump 530 is turned to the "on" position. When in the "on" position, the pump 530 circulates the heat transfer liquid between the second heat exchanger 510 to the third heat exchanger 520, through the liquid supply line 540 and the liquid return line 550. Thus, the heat transfer liquid receives thermal energy from the third heat transfer plate 500 and the temperature of the heat transfer liquid rises. The heated heat transfer liquid may then be transported/circulated by the pump 530, through the liquid supply line 540 to the third heat exchanger 520, where it may substantially fill the internal volume of the third heat exchanger 520. Once filled, the heat transfer liquid may contact the first heat transfer plate 280. This plate may initially be at a relatively cool operating temperature (e.g. $T_C$), due to an outlet path for heat transfer to the external environment (e.g. airflow 295), as described above. Thus, heat may be transferred from the relatively high temperature heat transfer liquid to the relatively low temperature first heat transfer plate 280. At least a portion of the transferred energy may then generate electricity at the energy converter 150, with an unconverted portion potentially ejected to an airflow 295 (e.g. heat sink). This process lowers the temperature of the heat transfer liquid, which may then be pumped and/or drains by gravity back to the second heat exchanger 510, where it may be reheated and/or recirculated, as just described. Thus, the discharging of the power system 100 may be continuously maintained as long as sufficient thermal energy remains in the thermal energy storage system 130 (e.g. until the PCM solidifies).

Once discharging of the power system 100 is complete, or electricity generation is no longer needed, the pump 530 may be turned off stopping the circulation of heat transfer liquid between the second heat exchanger 510 and the third heat exchanger 520. In some embodiments of the present disclosure, the pump 530 may be a positive displacement pump. In some embodiments of the present disclosure, the pump 530 may be an electromagnetic pump and/or a mechanical pump. As in the embodiments of FIGS. 3a, 3b, 4a and 4b, the configuration in FIG. 5 allows for simultaneous charging and discharging by running the pump while energy is being input into the system. It also allows for stopping or pausing discharging before the PCM 240 is fully solidified by turning off the pump.

Note that in the embodiment of FIG. 5, there is no phase change occurring to the heat transfer liquid; as the heat transfer liquid heats and/or cools, it remains in the liquid state. So, in this example, heat transfer from the third heat transfer plate 500 to the heat transfer liquid, and from the heat transfer liquid to the first heat transfer plate 280, is by sensible heating and cooling of the heat transfer liquid only. Examples of the heat transfer liquid include sodium, and/or potassium. For these metal heat transfer liquids, an electromagnetic pump may be used to circulate the liquid.

Figure 6:
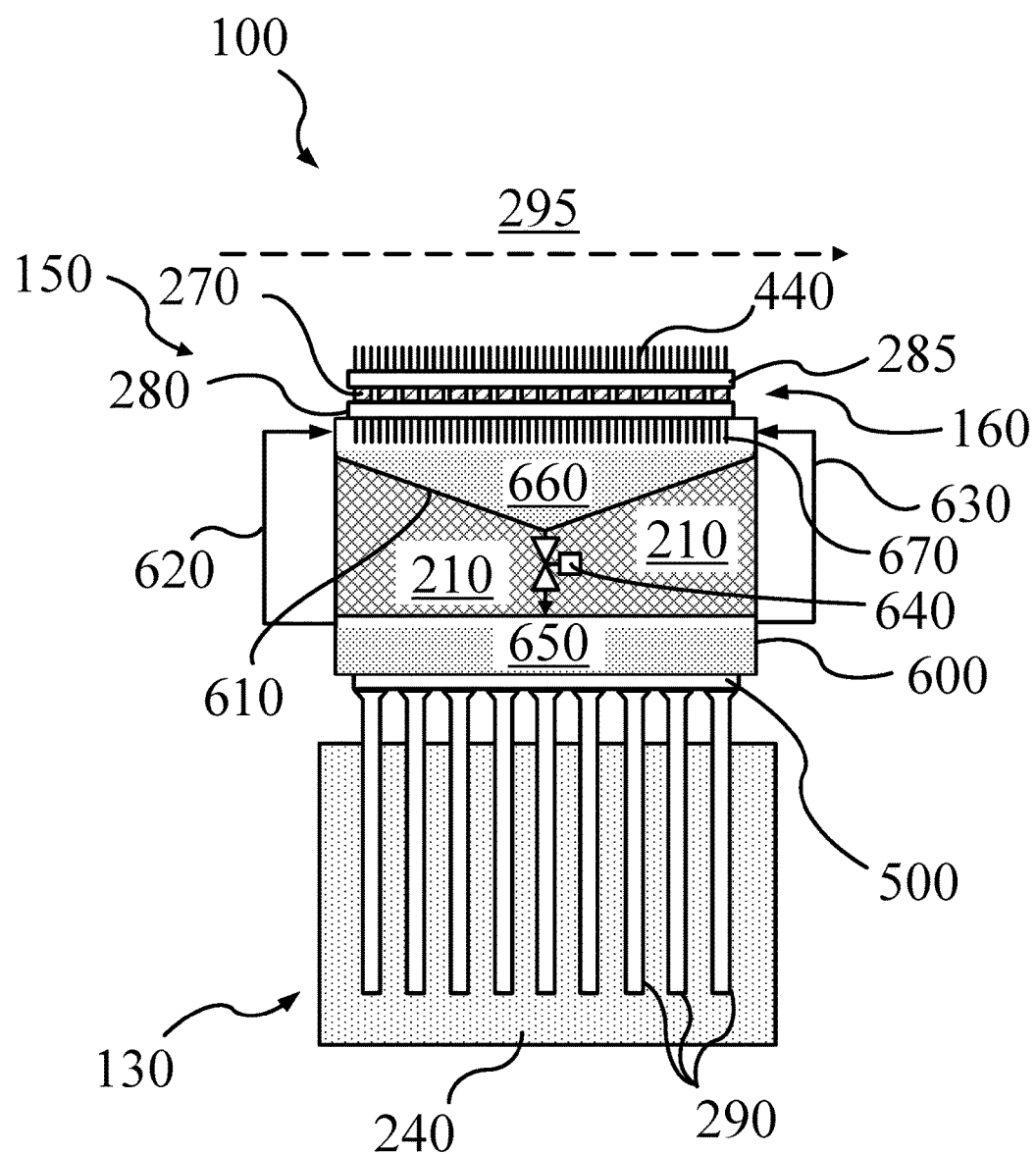
FIG. 6 illustrates a power system utilizing, among other things, a circulating heat transfer fluid between an evaporator and a condenser as a thermal valve, according to some embodiments of the present disclosure.

FIG. 6 provides another example of a power system 100 that utilizes a second heat transfer fluid, separate and distinct from the first heat transfer fluid contained within the heat pipes 290, where, unlike the example shown in FIG. 5, the second heat transfer fluid undergoes a reversible liquid/vapor phase change to transfer thermal energy from the thermal storage system 130 to the energy converter 150. The thermal storage system 130 of FIG. 6 (e.g. the PCM 240, heat pipes 290, heat transfer fluid, etc.) may be substantially similar to the thermal storage systems described previously. The same is true for the heat exchanger 160 (e.g. the first heat transfer plate 280, the second heat transfer plate 285, the energy converter 150, the first set of fins 440 and their relationship to an airflow 295, etc.) So, additional detailed description of these elements and features are not repeated here. Instead, a detailed desctiption is provided of an alternative embodiment for a thermal valve for on-demand switch between "charging" and "discharging" states.

FIG. 6 illustrates a thermal valve that has a number of elements working in cooperation together, and is similar in some regards to the thermal valve described for FIG. 5. As in the previous embodiment of thermal valves describe above, the example of FIG. 6 also has at least two positions, a first "closed" position for charging the power system 100, and a second "open" position for discharging the power system to produce electricity. The power system 100 may be switched between the positions, as needed, through the use of a second heat transfer fluid. This second heat transfer fluid is separate and distinct from the heat transfer fluid contained in the heat pipes 290.

The thermal valve of FIG. 6 includes a number of elements and features, including an evaporator 600 in thermal communication with heat pipes 290. This thermal communication may be established by sandwiching a third heat transfer plate 500 between the heat pipes 290 and the evaporator 600. The thermal valve may also include a condenser 610 in thermal communication with a first heat transfer plate 280 that is in contact with the cold-side of an energy converter 150 (as described previously). In FIG. 6, the energy converter 150 is shown to be a plurality of TEG modules 270, but it is to be understood that the TEGs could be replaced by another energy converter, such as a Stirling engine. The evaporator 600 and the condenser 610 are configured to be in fluid communication with each other. The evaporator 600 and the condenser 610 may be in fluid communication due to a first vapor supply line 620 and a second vapor supply line 630 linking them together (e.g. a pipe or other conduit).

The thermal valve of this embodiment, as described above, also includes the second heat transfer fluid, which is contained within the evaporator 600 and the condenser 610, within a first fluid volume 650 and second fluid volume 660, respectively, which may be physically separated from each other by insulation 210. The thermal valve of this embodiment also contains a mechanical valve 640, positioned between the condenser 610 and the evaporator 600. These elements function together to yield a switchable thermal valve that may be switched, on-demand, between the "open", charging position and the "closed", discharging position.

When discharging the power system 100 illustrated in FIG. 6, thermal energy may be transferred from the thermal storage system 130 to the energy converter 150, by the cyclic and repeated vaporization and condensation of the second heat transfer fluid. The mechanical valve 640 is positioned in an open position for the cycle to continue. Starting with the first fluid volume 650 of the evaporator 600, the second heat transfer fluid may be heated by the transfer of thermal energy from the heat pipes 290, through the third heat transfer plate 500, and into the second heat transfer fluid contained in the evaporator 600. If the second heat transfer fluid is initially below its boiling point temperature, it m gradually heat up and its temperature will increase. Eventually, the second heat transfer fluid may attain its boiling point temperature and begin to vaporize. The second heat transfer fluid's vapor will pass through at least one of the first vapor supply line 620 and/or the second vapor supply line into the condenser 610. Since in this embodiment the heat exchanger 160 is typically exposed to a cooler external environment (e.g. airflow 295), the first heat transfer plate 280 may be at a relatively low temperature. Since the first heat transfer plate 280 is in thermal communication with at least one inside surface of the condenser 610, the condenser 610 may also be at a relatively low operating temperature that may be below the dew point temperature of the incoming second heat transfer fluid vapor. As a result, at least a portion of the vapor may condense on the lower temperature surfaces of the condenser 610. The condensed second heat transfer fluid may then collect in the second fluid volume 660 of the condenser and drain by gravity through the open mechanical valve 640, and the condensate may then be returned to the first fluid volume of the evaporator 600, where it may be reheated, revaporized, and the cycle started again. This cycle may be repeated continuously until the power system 100 is fully discharged and/or until the mechanical valve 640 is closed. FIG. 6 also illustrates that a second set of fins 660 may be included within the condensing zone of the condenser 610, to increase the surface area available for condensing the heat transfer fluid.

Figure 7A:
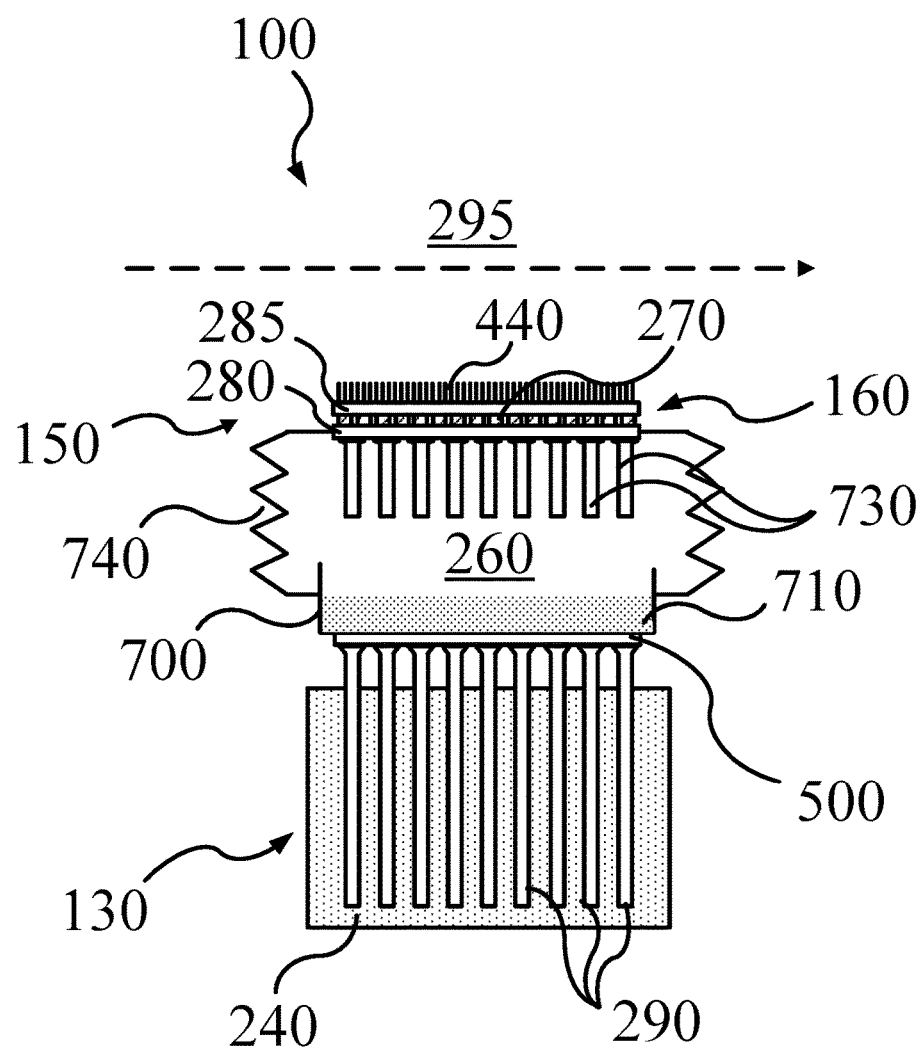
FIGS. 7a and 7b illustrate a power system utilizing, among other things, a moveable second set of heat pipes and a heat transfer liquid as a thermal valve, according to some embodiments of the present disclosure.
Figure 7B:
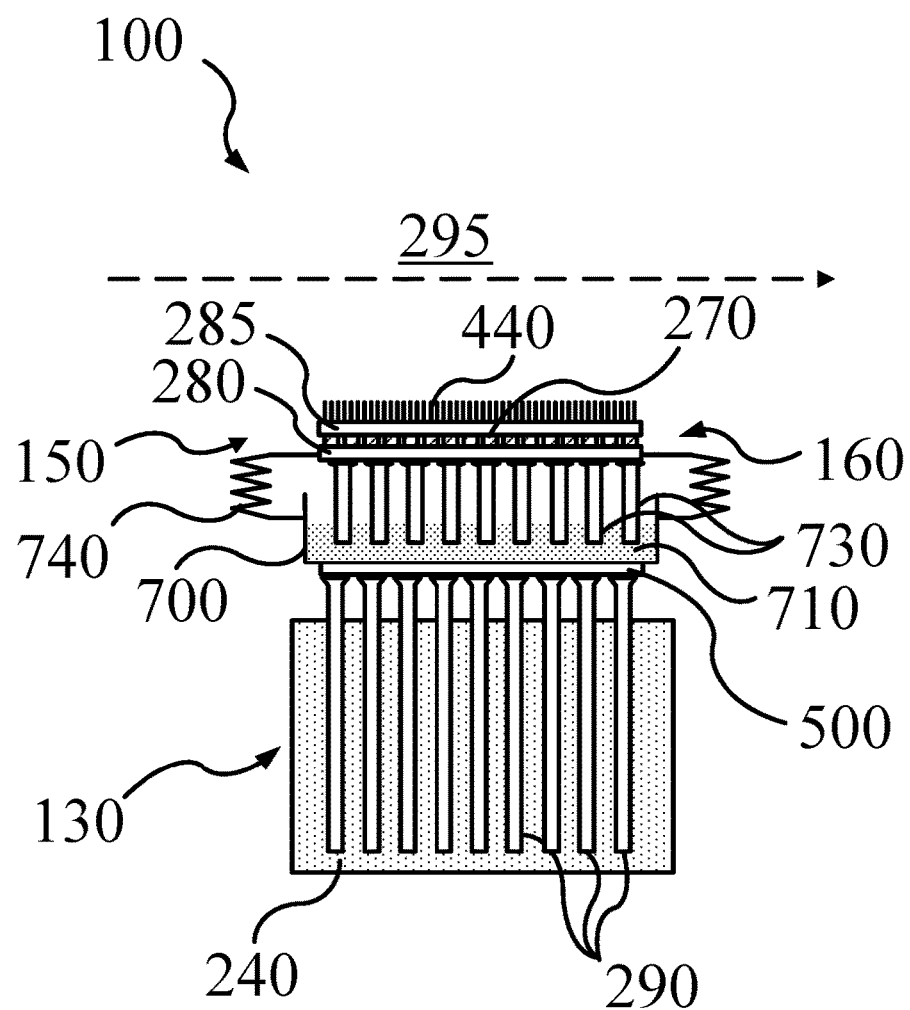

Placing the mechanical valve 640 in the closed position stops the discharging process and. enables charging to occur because the transfer of heat between the evaporator 600 and the condenser 610, affected by the continuously vaporizing and condensing second heat transfer fluid, is interrupted and/or stopped. Thus, a path for heat transfer from the thermal storage system 130 to the energy converter 150 is also interrupted and the thermal energy stored in the thermal storage system is retained there. The mechanical valve 640 halts the heat transfer process by retaining the second heat transfer fluid condensate in the condenser 610, so that it may not be vaporized in the evaporator 600. Thus, the condensing/vaporization cycle is broken and heat transfer is stopped. Note, that the insulation 210 positioned between the evaporator 600 and condenser 610 may insure that the lower surfaces of the condenser remain cool and do not themselves attain temperatures high enough to vaporize the second heat transfer fluid. So, some insulation 210 may be necessary to minimize conductive, convective, and/or radiant heat transfer from occurring between the evaporator 600 and the condenser 610, when the mechanical valve 640 is in the closed position. In addition, similar to the liquid return lines described for FIG. 5, the vapor supply lines (620 and 630) of FIG. 6 may be empty of vapor or liquid when the mechanical valve 640 is closed. Thus, the vapor supply lines (620 and 630) may likely provide a high enough resistance to heat transfer that minimal, if any, thermal "leakage" may occur from the evaporator 600 to the condenser 610, through the vapor supply lines (620 and 630), FIGS. 7a and 7b illustrates yet another example of a power system 100. FIG. 7a illustrates a "charging" state, where a thermal valve for the power system 100 is in a "closed" position, for collecting and storing thermal energy. FIG. 7b illustrates a "discharging" state, where the thermal valve for the power system 100 is in an "open" position, for converting thermal energy to electricity. Note that the receiver is not shown in FIGS. 7a and 7b. However, embodiments of receivers described previously may be implemented into the power system 100 shown in FIGS. 7a and 7b. Also, the thermal storage system 130 of FIGS. 7a and 7b (e.g. the PCM 240, heat pipes 290, heat transfer fluid, etc.) may be substantially similar to the thermal storage systems described previously. The same is true for the heat exchanger 160 (e.g. the first heat transfer plate 280, the second heat transfer plate 285, the TEGs 270, the first set of fins 440 and their relationship to an airflow 295, etc.) So, additional detailed description of these elements and features are not repeated here. Instead, a detailed description is provided of an alternative embodiment for a thermal valve for on-demand switch between "charging" and "discharging" states.

The example of FIGS. 7a and 7b, as in previous examples, includes a set of heat pipes 290 positioned to be in physical contact with a PCM 240, where the heat pipes 290 contain a heat transfer fluid. However, the power system 100 of FIGS. 7a and 7b includes a second set of heat pipes 730 configured to be movable between a first position where the second set of heat pipes 730 is placed in physical and/or thermal communication with a heat transfer liquid 710 contained in a vessel 700 (see FIG. 7a), and a second position where the second set of heat pipes 730 are not in physical and/or thermal communication with the heat transfer liquid 710 (see FIG. 7b). The vessel 700 may be configured to be in thermal communication with the first set of heat pipes 290 and may include an optional third heat transfer plate 500. In some examples, the heat transfer liquid 710 may be a liquid that does not typically undergo a phase change during normal operating conditions. In other examples, the heat transfer liquid 710 may undergo reversible liquid-to-solid phase change.

Thus, the power system 100 of FIGS. 7a and 7b may charge with thermal energy as described in earlier embodiments described herein. However, the thermal energy collected in the thermal storage system 130 will remain stored there, when the thermal valve is in the "closed" position, as shown in FIG. 7a. In this position, the heat transfer fluid 710 may come to a thermal equilibrium with the third heat transfer plate 500 and/or the thermal storage system 130. This may also be at an equilibrium temperature that is close to or equal to the melting point temperature of the PCM 240. If energy input into the power system 100, for example solar energy, is continued, the temperature of the PCM 240 may continue above its melting point temperature and the operating temperature of the heat transfer liquid 710 may continue to rise as well. However, in some embodiments, once substantially all of the mass of the PCM 240 melts, the power system 100 will be considered fully charged, and energy input into the power system 100 will be halted. Regardless, an empty volume 260 (or space) may be maintained between the heat transfer liquid 710 and the second set of heat pipes. This empty volume 260 may provide sufficient resistance to heat transfer between the heat transfer liquid 710 and the second set of heat pipes 730 that the energy converter 150 does not convert a significant amount of thermal energy to electricity.

FIG. 7b illustrates the thermal valve's "open" position when discharging thermal energy from the thermal storage system 130. In the "open" position the second set of heat pipes 730 are lowered to be in physical/thermal communication with the heat transfer liquid 710. Thus, a path for heat transfer may be created between the relatively high temperature PCM 240, the heat transfer liquid 710 contained in the vessel 700, the second set of heat pipes 730, and the energy converter 150. Thus, the energy converter 150 (e.g. TEGs 270) may convert the thermal energy transferred to them via this pathway to electricity. Electricity may continue to be generated as long as a sufficient differential temperature is maintained across the hot-side and cold-side of the TEGs 270, as described previously (e.g, with an outlet for non-converted thermal energy provided by the heat exchanger 160 to the external environment).

The power system 100 of FIGS. 7a and 7b may also include a seal, for example a movable bellows seal 740, to help isolate the heat transfer liquid 710 from the surrounding environment. Thus, a bellows seal 740 may help to minimize heat losses to the surrounding environment, by radiation heat loss, convective heat loss, and/or conductive heat loss, etc. Thus, a movable bellows seal 740 may be configured to expand and collapse upon itself, to move between a first position, where the bellows seal 740 is expanded to allow the second set of heat pipes 730 to move away from the heat transfer fluid 710, and a second position where the bellows seal 740 is retracted to allow the second set of heat pipes 730 to be placed in physical and/or thermal communication with the heat transfer liquid 710. Thus, a bellows seal 740 may be configured into an accordion-like structure, telescoping structure, and/or any other suitable expandable and contracting structure that enables the second set of heat pipes 730 to move reversibly between the two positions.

It should be noted, that the second set of heat pipes 730 shown in FIGS. 7a and 7b may operate in significantly the same manner as the first set of heat pipes 290. Thus, the second set of heat pipes 730 may contain a heat transfer fluid to transfer thermal energy from the heat transfer liquid 710 contained in the vessel 700 to the energy converter 150. So, the heat transfer fluid contained in the second set of heat pipes 730 may be capable of undergoing reversible phase change between a gas and a liquid. Further, the heat transfer fluid contained in the second set of heat pipes 730 may typically undergo vaporization in a first section of the second set of heat pipes 730 positioned in the heat transfer liquid 710, and condensation in a second section of the second set of heat pipes 730 positioned to be in thermal communication with the first heat transfer plate 280. However, as described above for the first set of heat pipes 290, the heat transfer fluid contained in the second set of heat pipes 730 may vaporize at any position along the vertical axis of the second set of heat pipes 730; vaporization may occur within a heat pipe at any surface that is at a temperature higher than or equal to the boiling point temperature of the heat transfer fluid. Similarly, the heat transfer fluid contained in the second set of heat pipes 730 may condense at any position along the vertical axis of the heat second set of heat pipes 730; condensation may occur within a heat pipe at any surface that is at a temperature lower than or equal to the dew point temperature of the heat transfer fluid.

In summary, when the power system 100 of FIG. 7a is charging, the thermal storage system 130 is thermally insulated against heat losses with the external environment and the thermal valve is in an "closed" position, such that,
1. A second set of heat pipes 730 is positioned to maintain an empty volume 260 between the second set of heat pipes 730 and heat transfer liquid 710 contained in a vessel 700; and
2. A bellows seal 740 is in an extended position.

When the power system 100 of FIG. 7b is discharging, the thermal storage system 130 is thermally connected with the external environment such that thermal energy may flow from the thermal energy storage system 130, through the energy converter 150 to generate electricity, such that,
1. The second set of heat pipes 730 is positioned within a heat transfer fluid 710 to allow the transfer of heat from a first set of heat pipes 290, to the heat transfer fluid 710, from the heat transfer fluid 710 to the second set of heat pipes 730, and subsequently to the energy converter 150; and
2. The bellows seal 740 is in a retracted position.

Referring again to FIGS. 7a and 7b, a third configuration may allow for simultaneous charging and discharging. Thermal energy may be optionally entering the power system 100 (e.g. solar energy), while at the same time thermal energy may be converted to electricity by the energy converter 150, in this configuration:
1. The second set of heat pipes 730 is positioned to be in physical and/or thermal communication with the heat transfer liquid 710; and
2. The bellows seal 740 is in a retracted position.

The configuration shown in FIGS. 7a and 7b may allow for simultaneous charging and discharging by placing the second set of heat pipes 730 in thermal communication with the heat transfer liquid 710. It also allows for stopping or pausing discharging before the PCM 240 is fully solidified by removing the second set of heat pips 730 from the heat transfer liquid 710.

Figure 8A:
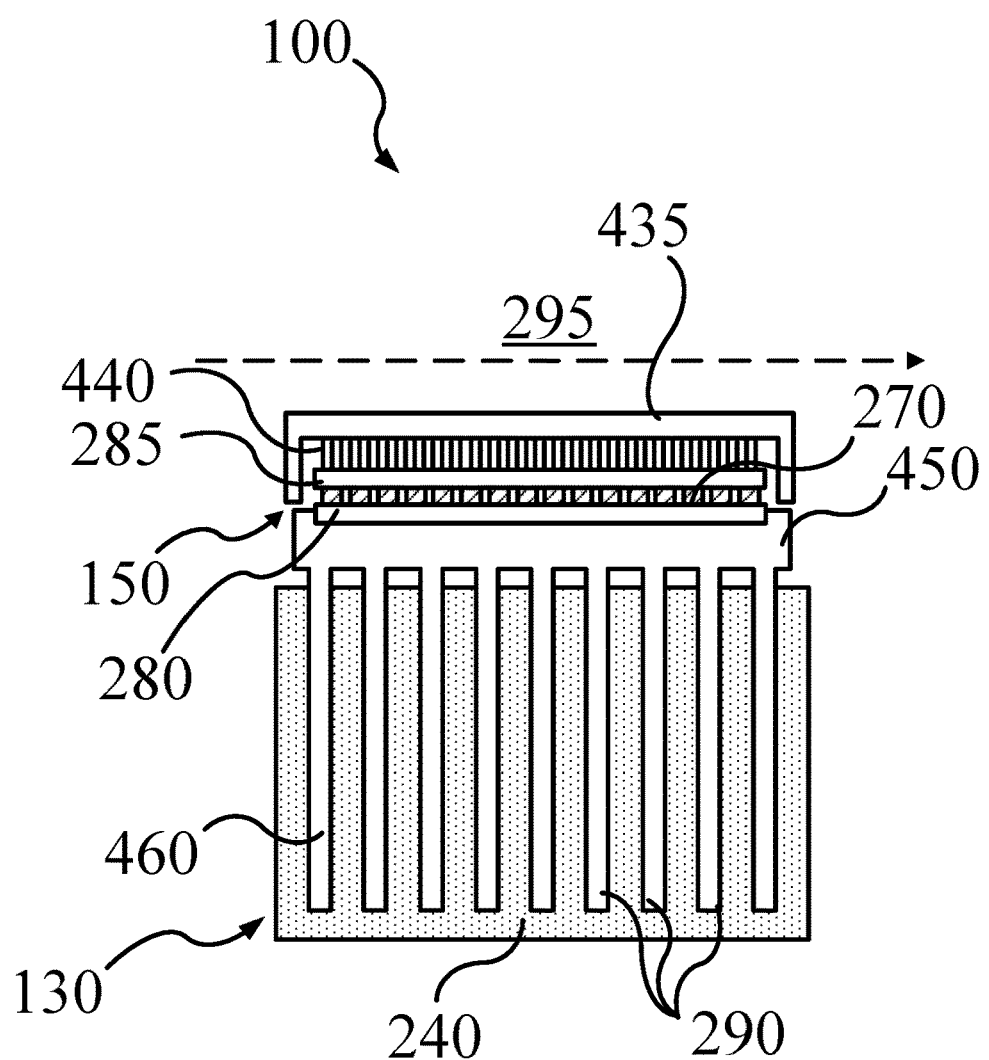
FIGS. 8a and 8b illustrate another embodiment of the example shown in FIGS. 4a and 4b, with another configuration for a condensing zone, according to some embodiments of the present disclosure.
Figure 8B:
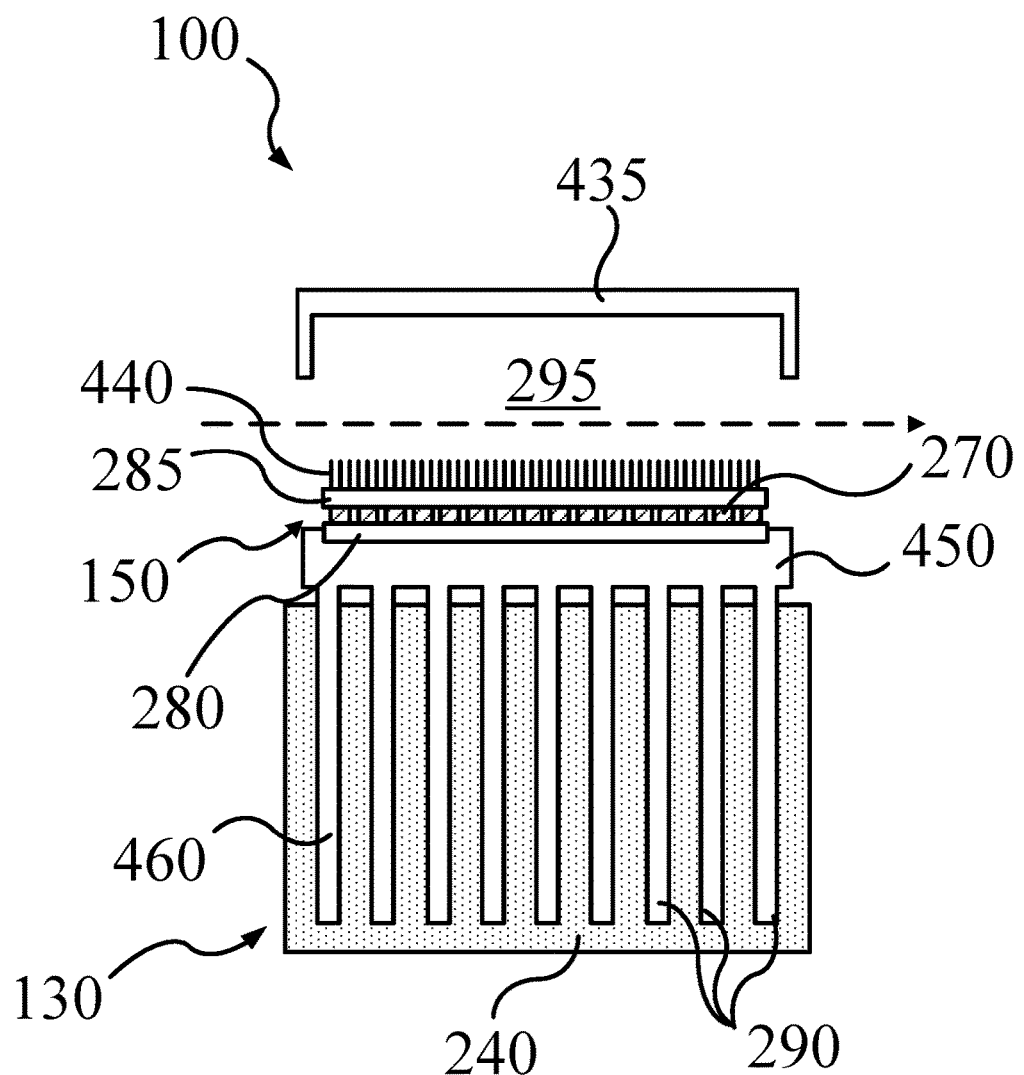

FIGS. 8a and 8b illustrate an alternative configuration for the condensing zones 450 of heat pipes 290 (compare to FIG. 4). In this embodiment, a plurality of heat pipes 290 may be configured to share a single, widened condensing area, volume, and/or zone 450. A single, widened condensing zone 450 may maximize the surface area available for the heat transfer fluid contained within in the heat pipes 290, which may maximize the heat transfer rate to the TEG module (energy converter 150) and increase the electrical power output produced by the power system 100.

Figure 9:
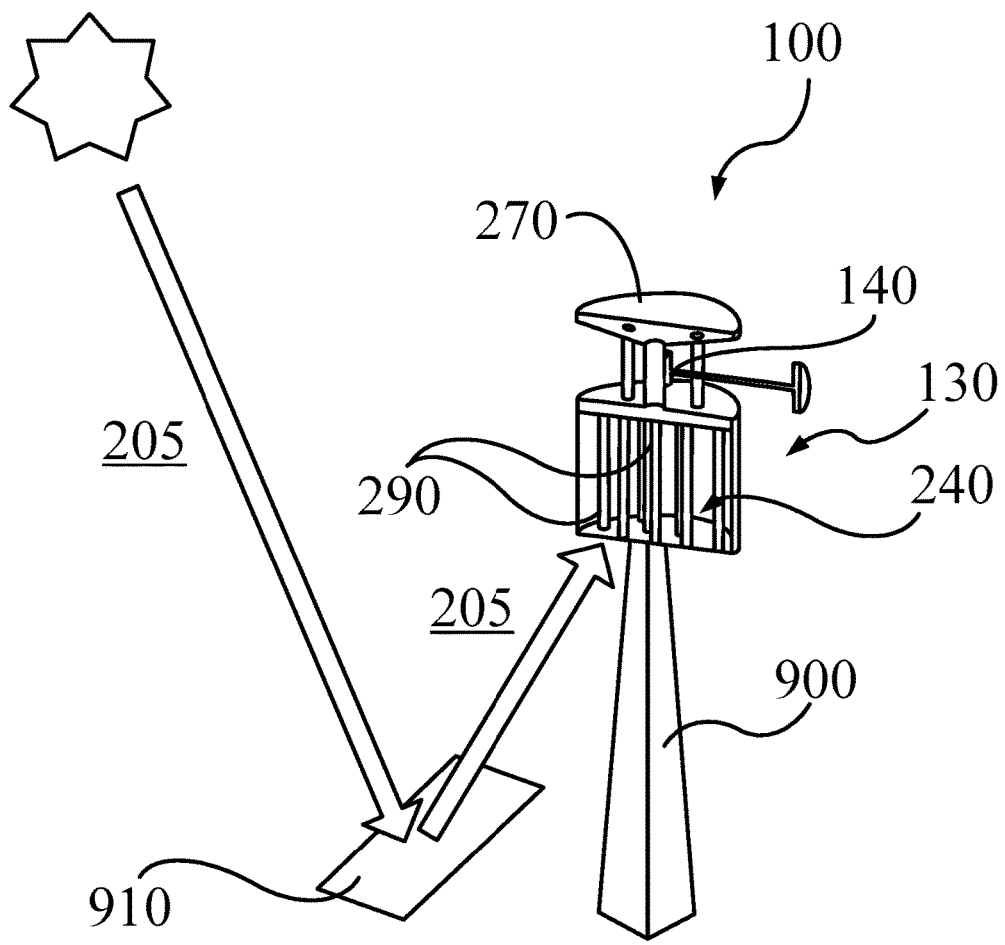
FIG. 9 illustrates an example of a proposed 3 kW dispatchable PCM/TEG thermal energy storage and power generation system, according to some embodiments of the present disclosure.

The following section provides modeling details of one example of a power system that utilizes some of the embodiments described herein, Referring to FIG. 9, a power system 100 is illustrated that receives light 205, in this case from the sun via one or more heliostats 910, to store thermal energy in a thermal storage system 130 that utilizes a phase change material 240. As described above, a plurality of heat pipes 290 may be positioned within the phase change material 240 to transfer energy from the phase change material 290 to a plurality of thermoelectric generators 270, when electricity generation is needed. The power system 100 may reversibly switch from energy storage to electricity generation by choosing the position of a thermal valve 140; e.g. when closed, the radiant energy received by the heat receiving surface of the thermal storage system 130 is stored in the phase change material 240; when opened, the radiant energy received by the heat receiving surface and/or the thermal energy stored in the phase change material 240 may be transferred by the heat pipes 290, through the thermal valve 140 to the thermoelectric generators 270.

An array of design criteria has been developed to theoretically demonstrate a power system similar to that shown in FIG. 9. For this theoretical example, the required electrical TEG output was assumed to be about 3 kW for about 9 hours, including 5 hours of generation from stored thermal energy. The PCM was an aluminum alloy with an operating temperature of 600° C. contained in a 0.914 m diameter tank. A TEG efficiency of about 9% and a thermal valve efficiency of about 90% were assumed, resulting in a required heat input from the PCM of about 37 kW. The thermal valve was modeled as stainless steel with a 4-layer woven mesh wick on the evaporator and the compatible working fluid is sodium (Na). The relevant design values are shown in Table 1.

TABLE 1

Parameters used to calculate thermal valve design

| Quantity | Value |
| --- | --- |
| Vessel Material | ¼" Stainless Steel 304 |
| Working Fluid | Sodium |
| Operating Temperature | 600° C. |
| Heat Transfer | 37 kW |
| Evap/Cond Diameter | 0.914 m |
| Na, Mass Flow Rate | 0.00873 kg/s |
| Na, Heat of Vaporization | 4236 KJ/kg |
| Na, Liquid Density | 805.4 kg/m$^3$ |
| Na, Vapor Density | 0.013 kg/m$^3$ |

Figure 10A:
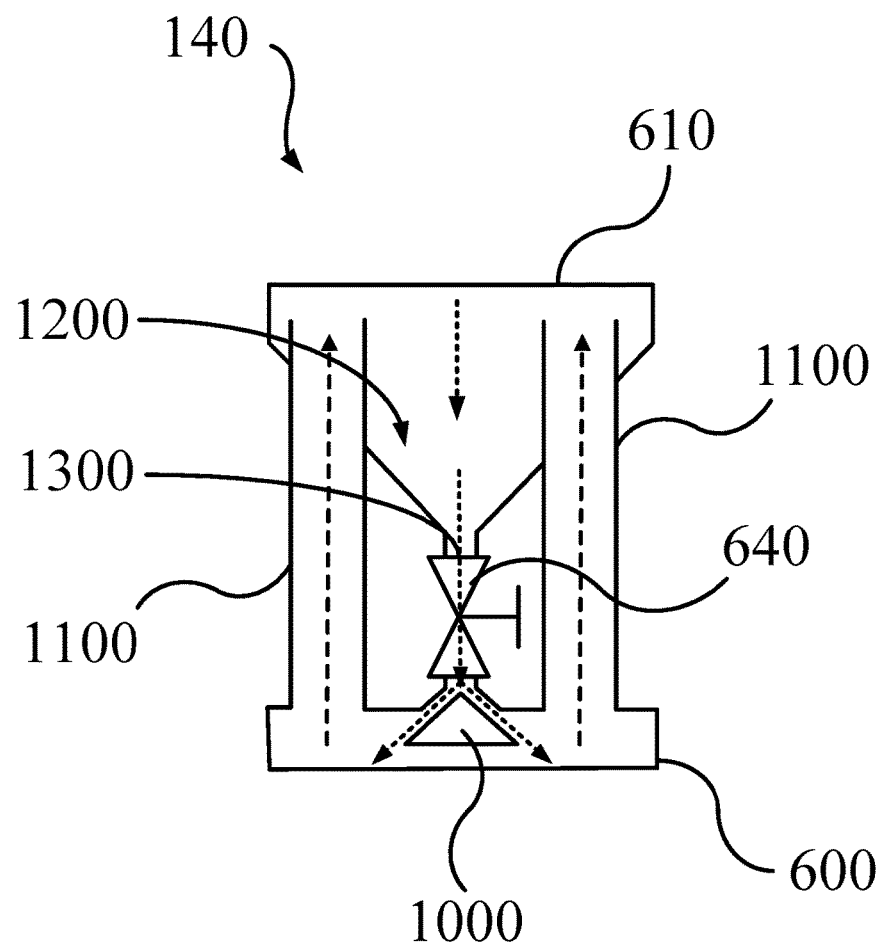
FIGS. 10a and 10b illustrate a thermal valve in the "on" state (a) and in the "off" state (b), according to some embodiments of the present disclosure.

The thermal valve 140 example modeled here, similar to that shown in FIG. 6, is based on a gravity-assisted thermosiphon. As illustrated in FIG. 10a, an evaporator 600 may be constructed as a horizontal surface at the bottom of a thermal valve 140, with a condenser 610 configured as a horizontal surface at the top of a thermal storage system (not shown)

The top of the thermal storage system (e.g. a PCM tank; not shown in FIGS. 10a and 10b) may contact the outer surface of the evaporator 600 to heat the working fluid contained within the thermal valve 140. This working fluid may then be vaporized and removed from the evaporator 600, such that the vapor flows (represented by the upward dashed arrows) through one or more vapor tubes 1100 by a pressure gradient, such that the vapor is transferred to the top inner condenser surface of the condenser 610 where the working fluid condenses. There, the working fluid's latent heat may be transferred through an outer wall of the condenser 610 to a heat sink (not shown), for example, to a TEG array (not shown). The working fluid condensate may then flow down a condensate funnel 1200, into a liquid return tube 1300 (e.g. liquid return line), and through an open mechanical valve 640 (e.g. a mechanical ball valve). From there, the working fluid condensate may flows over a diverter cone 1000 where it then returns to the evaporator where a wick (not shown) may pull and spread the liquid working fluid across the evaporator surface. The liquid working fluid may then absorb additional heat from the PCM through the evaporator wall, resulting in the re-vaporization of the working fluid to restart the heat pipe/thermosyphon cycle.

Figure 10B:
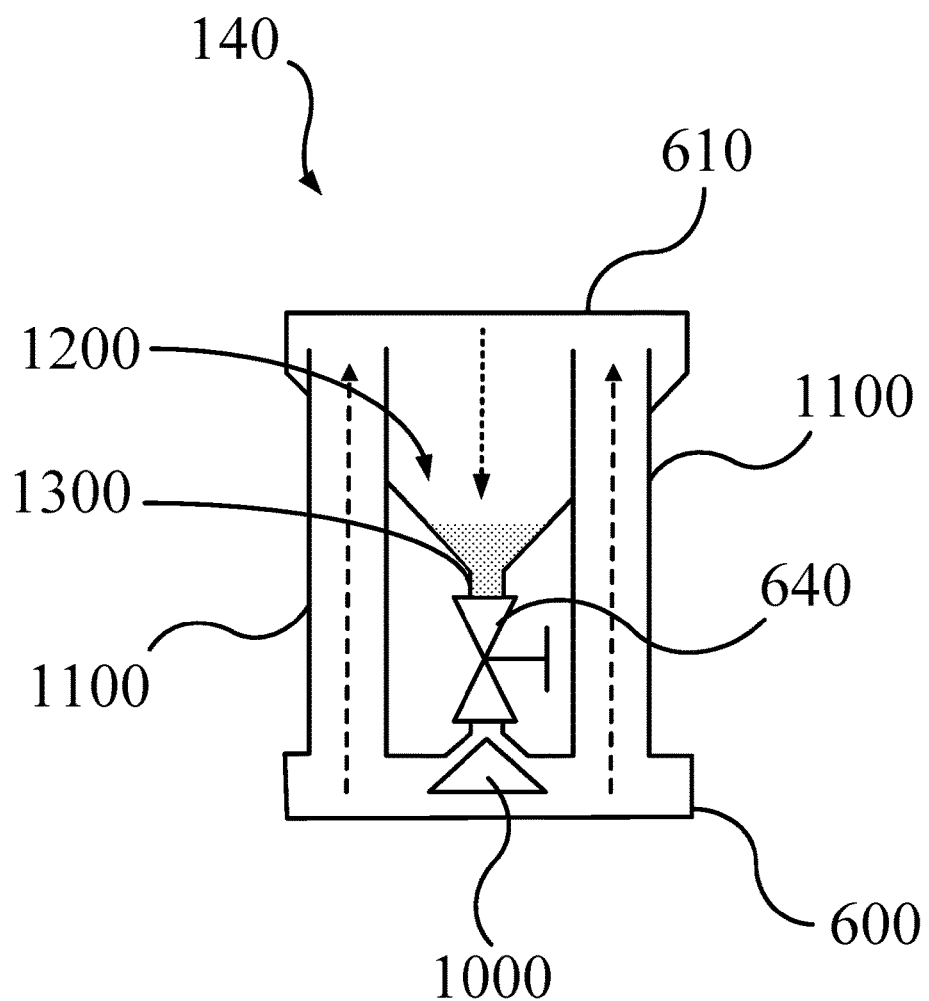

Referring to FIG. 10b, in the "off" state, the mechanical valve 640 is closed. Any liquid working fluid on the lower hot surface of the evaporator 600 evaporates, flows up the vapor tubes 1100, to condense in the condenser 610. The working fluid condensate may then flows down to collect in the funnel 1200, with access to the evaporator 600 blocked by the closed mechanical valve 640. As a result, the evaporator 600 may dry out, as substantially all of the working fluid may evaporate to condense and collect in the condenser. This in turn halts the heat pipe cycle. In this way, the flow of heat to the TEGs may be modulated as electrical demand requires.

The sections below present a detailed analysis of a pressure model and a thermal resistance model that investigate some embodiments of the present disclosure. A heat pipe pressure model was used to predict the operability of the power system summarized in Table 1 above. A heat pipe may function if the capillary pumping pressure exceeds the sum of all pressure drops and gains in the system. If the sum of the pressure losses/gains exceed the capillary pumping pressure, the evaporator may "dry-out", overheat, and may lose the ability to transfer a practical quantity of heat. This relation is expressed mathematically as, $$\Delta P_{cap,max} \geq \Delta P_l + \Delta P_v + \Delta P_e + \Delta P_c + \Delta P_g \quad (1)$$

where $\Delta P_{cap,max}$ is the maximum capillary pumping pressure of the wicking structure in the evaporator, $\Delta P_l$ is the pressure loss due to viscous energy losses in the liquid flow, $\Delta P_v$ is the pressure loss due to viscous energy losses in the vapor flow, $\Delta P_e$ and $\Delta P_c$ are the evaporation and condensation phase change pressure drops, and $\Delta P_g$ is the pressure loss or gain due to gravitational body forces.

The liquid returning to the evaporator from the liquid condensate tube should optimally spread evenly over the wicking surface with a low pressure loss due to viscous effects. A "diverter cone" was implemented in the design to minimize the distance that the liquid must travel to cover the entire evaporator surface. When dropping from the edges of the diverter cone, the liquid spreads radially inward and outward over the evaporator surface. The radial differential Darcy relation was used to calculate the viscous liquid pressure loss through the porous media of the multi-layer woven wicking structure, $$v = \frac{-\kappa}{\mu_l} \frac{dp}{dr} \quad (2)$$

where v is the discharge volume per unit area, κ is the permeability of the porous wick, $\mu_l$ is the liquid dynamic viscosity, and dp/dr is the change in pressure (p) over a radial distance (r). Replacing the discharge volume per unit area with the volume flow rate ($\dot{V}$) and the cross sectional area (2πrh) of the flow over a disc gives, $$\frac{\dot{V}}{2\pi r h} = \frac{-\kappa}{\mu_l} \frac{dp}{dr} \quad (3)$$

where r is the radius and h is the height of the flow area. To attain the change in pressure as a fluid moves from one radius ($r_1$) to another ($r_2$), the expression is rearranged and integrated.

$$\int_{r_1}^{r_2} \frac{dr}{r} = \int_{p_1}^{p_2} \frac{-2\pi h \kappa}{\mu_l \dot{V}} dp \quad (4)$$

That integration leads to the following expression, $$\ln\left(\frac{r_2}{r_1}\right) = \frac{-2\pi h \kappa}{\mu_l \dot{V}}(p_2 - p_1) \quad (5)$$

Isolating the pressure drop from $r_1$ to $r_2$ gives, $$(p_2 - p_1) = \frac{-\mu_l \dot{V}}{2\pi h \kappa}\ln\left(\frac{r_2}{r_1}\right) \quad (6)$$

Adding that the volume flow rate is related to the heat flow (q), the heat of vaporization ($H_v$), and the density ($\rho$), the following final expression represents the pressure loss of fluid flowing radially in a 2-D porous medium of a given porosity from $r_1$ to $r_2$.

$$\Delta p_l = \frac{-\mu_l q}{2\pi h \kappa \rho H_v}\ln\left(\frac{r_2}{r_1}\right) \quad (7)$$

This viscous liquid pressure loss through the wick was then compared to the capillary pumping pressure ($\Delta P_{cap,max}$) developed in the wick pores, given by the Young-Laplace relation $$\Delta P_{cap,max} = \frac{2\sigma}{r_{eff}} \quad (8)$$

where $\sigma$ is the liquid surface tension and $r_{eff}$ is the effective capillary radius of the wick pores.

Very small wick sizes promote higher capillary pumping pressure and may create many sites for vapor nucleation, while at the same time, increasing the viscous liquid pressure losses. Very large wick sizes provide little or no capillary pumping pressure and few sites for nucleation, though the losses due to viscous effects may be small. To find a reasonable balance between the two extreme effects, the viscous liquid pressure losses and the corresponding capillary pressures for an array of mesh sizes was plotted and is shown in FIG. 11.

Figure 11:
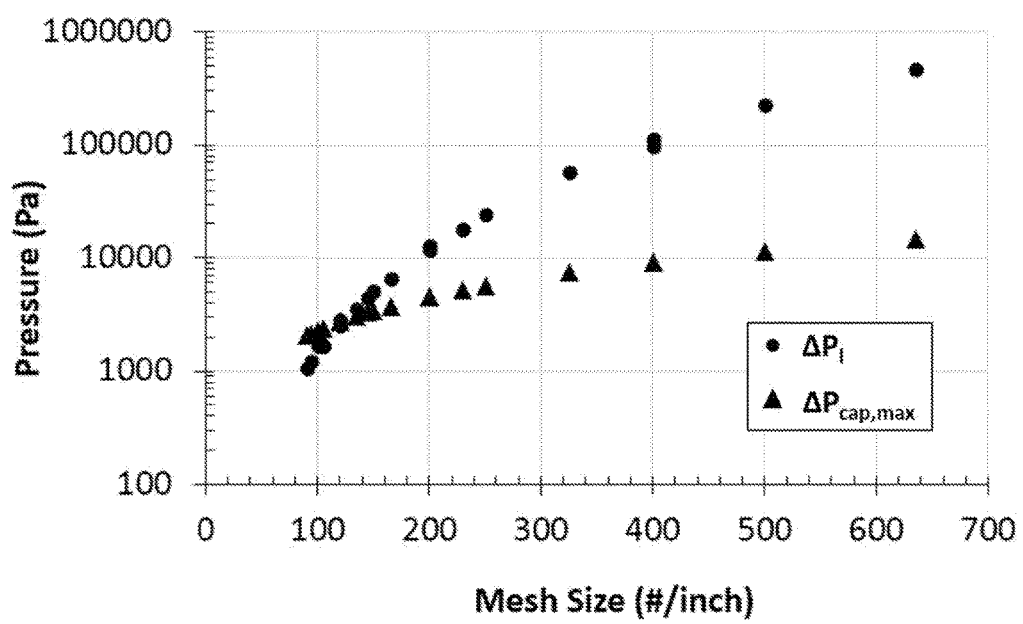
FIG. 11 illustrates data showing the relationship between the viscous liquid pressure losses and corresponding capillary pumping pressure of various woven mesh sizes, according to some embodiments of the present disclosure.

FIG. 11 illustrates that the viscous pressure loss balances the capillary pumping pressure with a value of 2000 Pa with woven mesh sizes around 100 #/inch. Using a larger mesh size (smaller #/inch) would decrease the number of nucleation sites, resulting in diminished evaporative heat transfer rate while using a smaller mesh size would result in prohibitively high liquid viscous pressure loss. For the current design, it was concluded that four-layer 100 #/inch would provide a satisfactory balance between viscous losses and vapor nucleation.

Viscous vapor pressure loss occurs when the vapor flows from the evaporator to the condenser through the vapor passageway. In the thermal valve design presented here, the vapor travels through three vertical vapor tubes. Given the design heat flow of 37 kW and the heat of vaporization of Na, the required vapor volume flow rate is 0.672 m³/s. The vapor velocity of this device is designed to the incompressible regime and with a Mach number<0.2. The speed of sound in the Na vapor at 600° C. is calculated with the Newton-Laplace relation, $$v_{sound} = \sqrt{\frac{\gamma R T}{M}} \quad (9)$$

where $\gamma$ is the adiabatic index which is 5/3 for the monatomic sodium vapor. R is the molar gas constant (8.315 J/mol·K), T is the absolute temperature, and M is the molar mass of the vapor. Using the design parameters of the thermal valve, the velocity of sound in the sodium vapor was found to be about 726 m/s, resulting in a vapor tube velocity of 145 m/s at Mach 0.2. The vapor tube diameter for this design was then specified to be about 4.43 cm.

Now, knowing the vapor tube diameter, the vapor viscous pressure loss was then determined. First, the friction Reynold's number was calculated using the relation, $$(f_v Re_v) = 0.038\left[\frac{2(r_{h,v})q}{A_v \mu_v H_v}\right]^{3/4} \quad (10)$$

where $r_{h,v}$ is the vapor tube hydraulic radius, $A_v$ is the vapor area, and $\mu_v$ is the vapor viscosity. This was then used to calculate the pressure drop using the following relation, $$\Delta P_v = \left[\frac{C(f_v Re_v)\mu_v}{2r_{h,v}^2 A_v \rho_v H_v}\right]L_{eff} q \quad (11)$$

where C is 1.00 for incompressible flow and $L_{eff}$ is the effective length of the vapor flow. Using the given system design parameters, the resulting vapor viscous pressure drop is 46.0 Pa.

Besides the major viscous losses due to vapor and liquid flow, there may be other pressure losses and gains in a thermal valve system. The hydrostatic pressure gain of the thermal valve is due to the gravity return of the condensate from the condenser back down to the evaporator. This gain is simply calculated from the Bernoulli relation, $$\Delta P_g = \rho_l g h \quad (12)$$

where g is the acceleration due to gravity and h is the height from the evaporator surface to the condenser surface. With the 0.899 m vertical height of the thermal valve, the resulting hydrostatic pressure gain is about 6724 Pa.

The final pressure terms, $\Delta P_e$ and $\Delta P_c$, develop across the condensation and evaporation phase change boundaries. These values are typically many orders of magnitude smaller than all other pressure terms for high-temperature heat pipes and were neglected for this analysis. Table 2 shows the magnitude of each of the contributing pressure terms for the 3 kW thermal valve device.

TABLE 2

Contributing pressure terms in the STEALS thermal valve and their calculated values.

| Pressure | Symbol | Value (Pa) |
|---|---|---|
| Capillary Pumping | $\Delta P_{cap,max}$ | +2394 |
| Viscous Liquid | $\Delta P_l$ | −2031 |
| Viscous Vapor | $\Delta P_v$ | −46.0 |
| Phase Change | $\Delta P_e$, $\Delta P_c$ | ~0 |
| Hydrostatic | $\Delta P_g$ | +6724 |
| Surplus | $\Delta P_{surplus}$ | +7041 |

Figure 12:
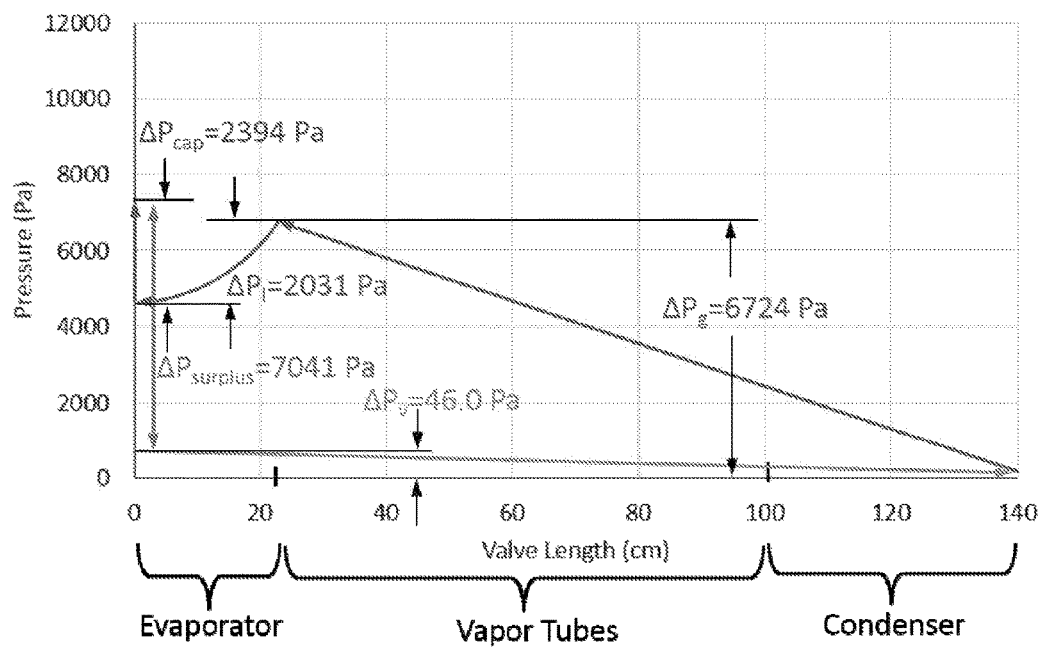
FIG. 12 illustrates a plot showing the liquid and vapor pressures along the length of the thermal valve, according to some embodiments of the present disclosure.

These values are plotted along the effective length of e thermal valve and are shown in FIG. 12.

Starting at the liquid/vapor surface of the evaporator, the vapor flows up through the vapor tubes where it then releases latent heat and condenses along the length of the condenser at 140 cm. That condensate then drops back down to the evaporator gaining a large hydrostatic pressure. The liquid then flows across the evaporator wick, losing viscous liquid pressure along the way. This liquid was pulled along the wick by the positive capillary pumping pressure provided by the wick capillary pores. Summing the calculated pressure drops results in a surplus of 7041 Pa around the system, indicating that the example device will function as intended.

Figure 13:
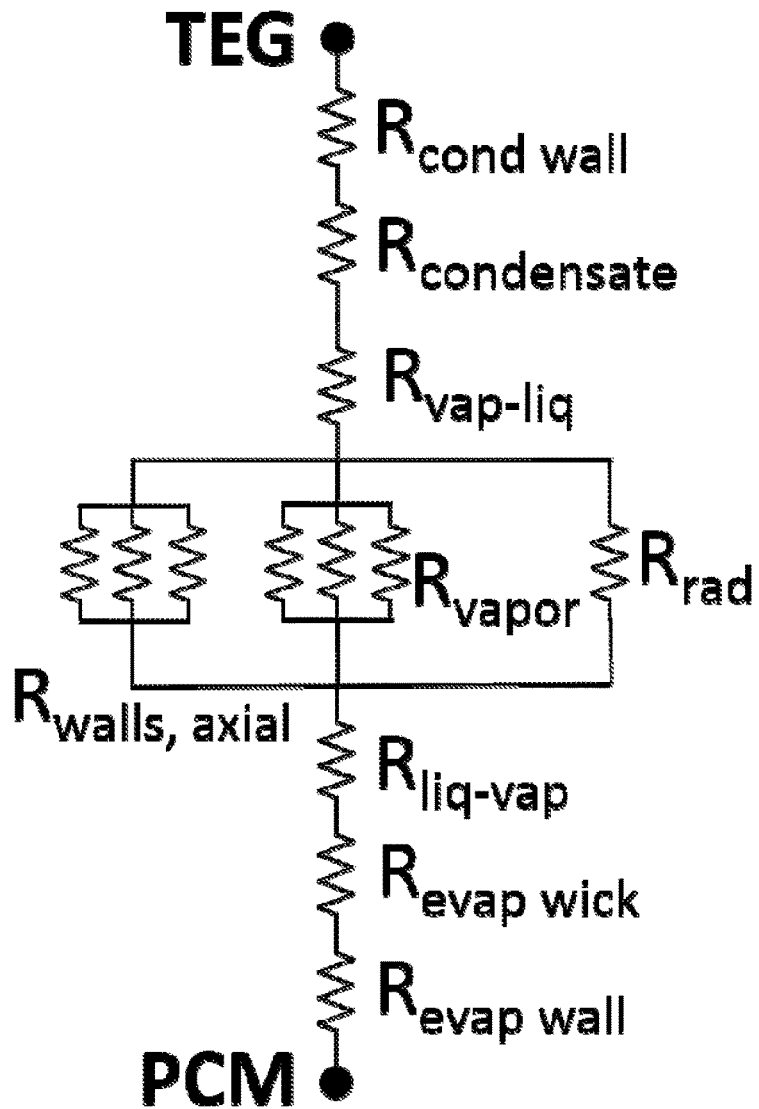
FIG. 13 illustrates a thermal resistance network showing each component of a thermal valve, according to some embodiments of the present disclosure.

A thermal resistance model was developed to predict the performance characteristics of the thermal valve in both the "on" state and the "off" state. A diagram of the contributing individual thermal resistances in a network is shown in FIG. 13. From the PCM, the heat flows through the evaporator wall, the saturated wick, and the liquid-vapor interface. From there, heat flows by pressure-driven convection with the Na vapor in the "on" state, by conduction through the vapor tube walls, and by radiation in the "off" state. At the condenser, the heat flows through the vapor-liquid interface, the condensate film, and through the condenser wall, where the heat is transferred through the TEG and finally rejected through a forced or natural convection heat sink.

Fourier's law was used to calculate the thermal resistance due to conduction heat transfer, $$R = \frac{\Delta x}{kA} \tag{13}$$

where $\Delta x$ is the material thickness, k is the thermal conductivity, and A is the cross sectional area. This relation was used to calculate the thermal resistance of the evaporator and condenser walls ($R_{evap,\ wall}$, $R_{cond,\ wall}$), the saturated wick ($R_{evap,\ wick}$), the axial heat transfer through the vessel walls ($R_{wall,\ axial}$), the axial vapor resistance in the "off" state ($R_{vapor}$), and the condensate film on the condenser ($R_{condensate}$).

The effective thermal conductivity of the sodium saturated multi-layer woven mesh wick was determined with the following relation, $$k_{eff,mesh} = \frac{k_l[(k_l + k_s) - (1 - \varphi)(k_l - k_s)]}{[(k_l + k_s) + (1 - \varphi)(k_l - k_s)]} \tag{14}$$

where $k_l$ is the liquid thermal resistance (sodium), $k_s$ is the solid thermal resistance (stainless steel), and $\varphi$ is the porosity of the wick. The thermal resistance of the flowing vapor in the "on" state was calculated with the following relation, $$R_{v,a} = \frac{T_v(P_{v,e} - P_{v,c})}{\rho_v H_v q} \tag{15}$$

where $T_v$ is the vapor temperature, $P_{v,e}$ and $P_{v,c}$ are the vapor pressures at the evaporator and condenser respectively. In the "off" state, the radiation heat transfer from the hot evaporator to the cooler condenser through the vapor tubes was calculated from the standard radiation relation, $$Q_{rad} = \sigma N_{tubes} \frac{T_{evap}^4 - T_{cond}^4}{R_{rad}} \tag{16}$$

where $\sigma$ is the Stefan-Boltzmann constant, $N_{tubes}$ is the number of vapor tubes, $T_{evap}$ and $T_{cond}$ are the evaporator and condenser temperatures, and $R_{rad}$ is the equivalent resistance of the radiation network. The radiation network of this power system consists of radiation directly from the evaporator to the condenser in parallel with the radiation from evaporator to the tube and then from the tube to the condenser and is represented by the following relation, $$R_{rad} = \frac{2}{A(F_{ec} + 1)} \tag{17}$$

where A is the cross-sectional area of the vapor tube and $F_{ec}$ is the view factor from one circular area to another parallel circular area. This is given by, $$F_{ec} = \frac{S - \sqrt{S^2 - 4}}{2} \tag{18}$$

where S is a geometric factor relating the circle radius to the distance between them.

The calculated values for each individual thermal resistance is shown in Table 3 below.

TABLE 3

Thermal resistance values of the thermal valve in both the "on" and "off" states.

| Resistance | Symbol | "On" Value (K/W) | "Off" Value (K/W) |
|---|---|---|---|
| Evaporator Wall | $R_{evap\ wall}$ | 0.000496 | 0.000496 |
| Evaporator Wick | $R_{evap\ wick}$ | $1.98 \times 10^{-5}$ | N/A |
| Liquid-Vapor Phase | $R_{liq\text{-}vap}$ | $1.27 \times 10^{-9}$ | N/A |
| Vapor | $R_{vapor}$ | $59.1 \times 10^{-6}$ | 13933 |
| Axial Walls | $R_{wall\ axial}$ | 72.8 | 72.8 |
| Radiation | $R_{rad}$ | N/A | 7.37 |
| Vapor-Liquid Phase | $R_{vap\text{-}liq}$ | $1.27 \times 10^{-9}$ | N/A |
| Condensate | $R_{condensate}$ | $4.26 \times 10^{-8}$ | N/A |
| Condenser Wall | $R_{cond\ wall}$ | 0.000496 | 0.000496 |
| Total | | 0.00103 | 5.65 |

Figure 14:
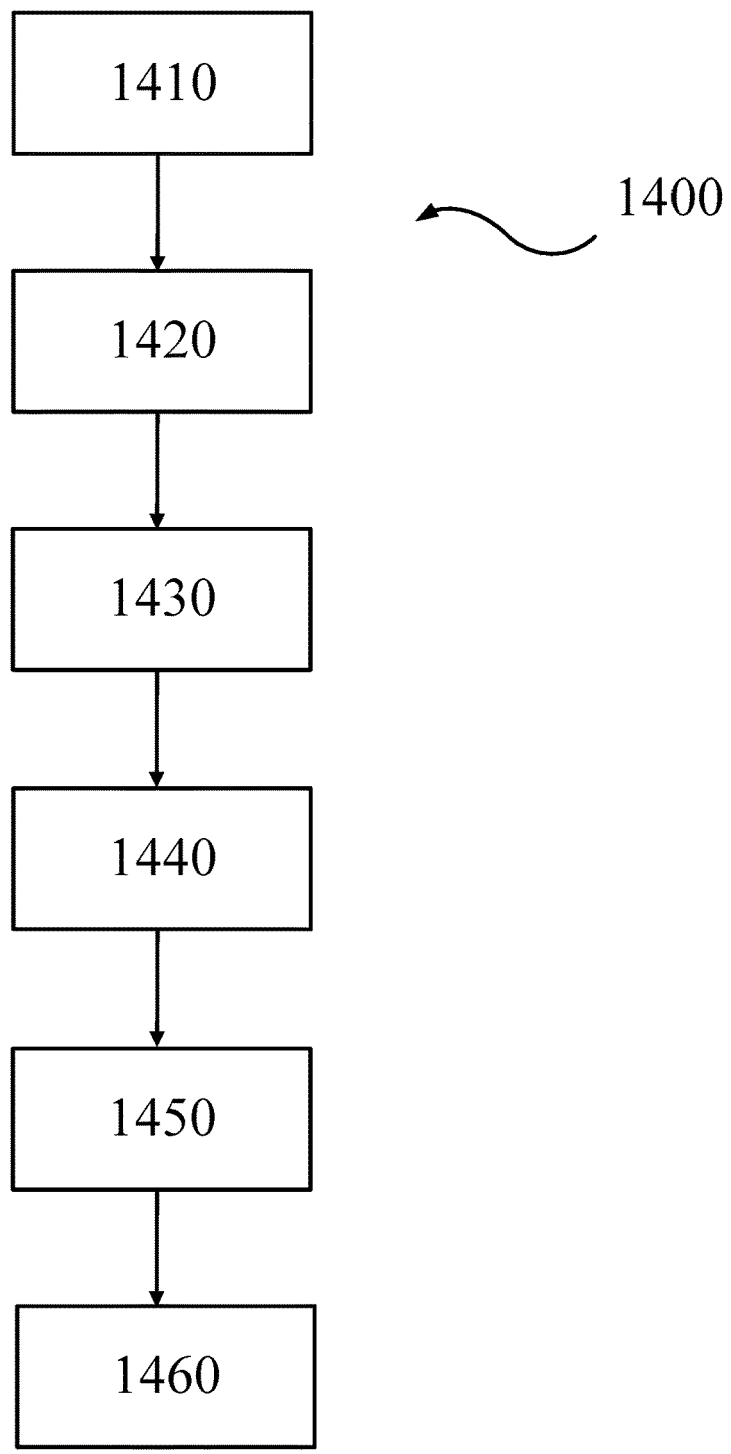
FIG. 14 illustrates a method for receiving, storing, and converting thermal energy to electricity, according to some embodiments of the present disclosure.

The thermal resistance analysis shows a 5500x change in total resistance from the "on" state to the "off" state. A graphical representation of the degree of thermal resistance and heat flow contributions is shown in FIG. 14.

It is evident that the largest contributors to the "on" thermal resistance are the evaporator and condenser walls at 48% each. The magnitude of these can be further decreased by applying thinner and/or more thermally conductive materials. The largest heat flow paths in the "off" state are the parallel paths of radiation through the vapor tubes (~77%) and solid conduction though the vessel walls (~23%). Radiation heat loss may be minimized with internal radiation shields above and/or below the vapor tubes or simply by bending an arc shape into the vapor tubes to minimize the line-of-sight from the evaporator to the condenser. Additionally, the axial heat loss through the walls may be reduced by applying thinner and/or less thermally conductive materials. Both of these diagrams indicate where optimization may improve the thermal performance characteristics of the device.

The pressure model was developed for the model power system. A summation of all pressures in the system concluded that it will function with a pressure surplus of 7 kPa, largely due to the hydrostatic pressure gain. Additionally, a thermal resistance network model was analyzed to determine the thermal performance of the device in the "on" and "off" states. The model predicts a 5500x difference between the "on" and "off" state thermal resistances.

As used herein, the term to be in "thermal communication" refers to the ability of a first object to transfer energy, e,g. heat, to a second object. This transfer of energy may occur by conduction, convection, radiation, and/or any other suitable means of heat transfer. As used herein, the term "substantially" refers to a complete whole or near complete whole of something, or the complete absence or near complete absence of something. This term may be used to recognize that in certain engineering circumstances obtaining 100% of something, e.g. heat transfer, or eliminating 100% of something, may not be physically possible. So, in some instances, "substantially" may refer to from 99% to 100%, from 98% to 100, from 97% to 100%, or from 90% to 100% of the metric being referred to. In some instances, "substantially" may refer to from 0% to 1%, from 0% to 2%, from 0% to 3%, or from 0% to 10% of the metric being referred to.

FIG. 14 illustrates a method 1400 for receiving themial energy from an energy source, storing the thermal energy received, and converting the thermal energy to electricity. In some embodiments of the present disclosure, the method 1400 may begin by receiving thermal energy 1410 from an energy source (e.g. solar, geothermal, industrial). The receiving of the thermal energy 1410 may be accomplished using a suitable receiver, as described above. The method 1400 may then include the transferring of the thermal energy 1420 to a phase change material (PCM), where the PCM may be stored in an appropriately sized container, as described above. The thermal energy transferred to the PCM may then by stored there for a period of time or immediately transferred to the next step of the method 1400. For example, the method 1400 may include storing of the thermal energy 1430 in the PCM for a desired amount of time, before delivering the thermal energy 1440 stored in the PCM to a heat transfer fluid, as described above. Alternatively, the method 1400 may immediately transfer the thermal energy transferred to the PCM by delivering the thermal energy 1440 to the heat transfer fluid. The method 1400 may also include transferring the thermal energy to an energy converter 1450 and converting the thermal energy to electricity 1460, as described above.

EXAMPLES

Example 1

A system comprising: a container comprising an internal volume at least partially defined by a wall having an external surface; a moveable surface having a first position and a second position; and a heat transfer fluid positioned within the internal volume, wherein: when in the first position, the moveable surface is substantially thermally isolated from the external surface such that substantially no heat is transferred from the heat transfer fluid, through the external surface, to the moveable surface, and when in the second position, the moveable surface is in thermal communication with the external surface such that heat is transferred from the heat transfer fluid, through the external surface, to the moveable surface.

Example 2

The system of Example 1, further comprising: a ram having a retracted position and an extended position, wherein: the moveable surface is physically attached to the ram, when in the retracted position, the ram places the moveable surface in its first position, and when in the extended position, the ram places the moveable surface in its second position.

Example 3

A system comprising: a container comprising an internal volume at least partially defined by a wall having an external surface; a moveable surface having a first position and a second position; a first heat transfer fluid positioned within the internal volume; and a second heat transfer fluid positioned external to the internal volume, wherein: when in the first position, the moveable surface is positioned between the external surface and the second heat transfer fluid such that the first heat transfer fluid is substantially thermally isolated from the second heat transfer fluid, and when in the second position, the moveable surface is positioned such that the first heat transfer fluid is in thermal communication with the second heat transfer fluid such that heat is transferred from the first heat transfer fluid to the second heat transfer fluid, through the external surface.

Example 4

A system comprising: a first container comprising a first internal volume at least partially defined by a first wall; a first heat transfer fluid positioned within the first internal volume; a second container comprising a second internal volume at least partially defined by a second wall; a second heat transfer fluid positioned within the second internal volume; a fluid conduit that fluidly connects the first internal volume with the second internal volume; a fluid transport means positioned within the fluid conduit and having a first position and a second position; and an energy converter configured to be in thermal communication with the second wall, wherein: when in the first position, the second heat transfer fluid is substantially thermally isolated from the energy converter, when in the second position, heat is transferred from the first heat transfer fluid through the first wall to the second heat transfer fluid, when in the second position, a portion of the heat transferred is delivered from the second heat transfer fluid through the second wall to the energy converter by cycling, using the fluid transport means, the second heat transfer fluid from the first container to the second container, and from the second container back to the first container, and the energy converter converts the portion of the heat transferred to electricity.

Example 5

The system of Example 4, wherein: the second heat transfer fluid is a liquid, the fluid transport means consists of a pump, when in the first position, the pump is off, when in the second position, the pump is on such that the pump transports the second heat transfer fluid from the first container to the second container, and the heat transfer fluid is transported from the second container to the first container by gravity.

Example 6

The system of Example 4, further comprising: a mechanical valve; and a vapor conduit that fluidly connects the first internal volume with the second internal volume, wherein: the second heat transfer fluid is in at least one of a liquid state or a vapor state, when in the first position, the mechanical valve is closed such that substantially all of the second heat transfer fluid is accumulated in the second internal volume in the liquid state, when in the second position, the mechanical valve is open such that the second heat transfer fluid is converted from the liquid state to the vapor state, the second heat transfer fluid in the vapor state is transported from the first container through the vapor conduit to the second container, the second heat transfer fluid in the vapor state condenses on the second wall to form the second heat transfer fluid in the liquid state, and the second heat transfer fluid in the liquid state returns through the open valve to the first container, and the fluid transport means consists of a vacuum created by the condensing second heat transfer fluid and gravity.

Example 7

A system comprising: a first container comprising a first internal volume at least partially defined by a first wall; a first heat transfer fluid positioned within the first internal volume; a second container comprising a second internal volume at least partially defined by a second wall in thermal communication with the first wall; a second heat transfer fluid positioned within the second internal volume; a third container comprising a third internal volume at least partially defined by a third wall and a fourth wall; a third heat transfer fluid positioned within the third internal volume, and an energy converter configured to be in thermal communication with the fourth wall, wherein: the third container has a first position and a second position, when in the first position, the third container is positioned to be substantially thermally isolated from the second heat transfer fluid such that substantially no heat is transferred to the energy converter, when in the second position, the third container is positioned in thermal communication with the second heat transfer fluid such that heat is delivered from the first heat transfer fluid to the second heat transfer fluid through the first wall and the second wall, at least a first portion of the heat delivered is transferred from the second heat transfer fluid to the third heat transfer fluid through the third wall, and at least a second portion of the heat delivered is transferred from the third heat transfer fluid to the energy converter through the fourth wall, such that the energy converter converts the second portion of the heat to electricity.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate aspect, embodiment, or configuration,

What is claimed is:

1. A system comprising:
a thermal valve having a first position and a second position; a heat transfer fluid;
a receiver configured to receive thermal energy; a phase change material (PCM);
a heat pipe comprising a first internal volume at least partially defined by a first wall and a second wall; and
an energy converter, wherein:
the heat transfer fluid is positioned within the first internal volume, the PCM is in thermal communication with the heat transfer fluid through the first wall, the energy converter is configured to be in thermal communication with the heat transfer
fluid through the second wall,
when in the first position, the thermal valve prevents the transfer of the thermal energy from the PCM to the energy converter, and enables the transfer of the thermal energy from the receiver to the PCM, and
when in the second position, the thermal valve enables the transfer of the thermal energy from the PCM to the heat transfer fluid and the energy converter, such that the energy converter converts at least a portion of the thermal energy to electricity.

2. The system of claim 1, wherein
the thermal energy comprises at least one of solar energy, geothermal energy, or energy from industrial sources.

3. The system of claim 2, wherein:
when in the first position, the thermal valve thermally and physically separates the second wall from the energy converter, and
when in the second position, the energy converter is in physical contact with the second wall.

4. The system of claim 1, wherein the heat pipe is in the form of at least one of a vertically oriented cylinder or vertically oriented duct.

5. The system of claim 4, further comprising a wicking structure positioned within the first internal volume.

6. The system of claim 1, wherein the energy converter comprises at least one of a thermoelectric generator or a heat cycle.

7. The system of claim 6, wherein the heat cycle comprises at least one of a Stirling Cycle, a Ranking Cycle, or a Brayton Cycle.

8. The system of claim 1, further comprising:
a container having a second internal volume, wherein:
the PCM is positioned within the second internal volume, and the heat pipe is at least partially immersed in the PCM.

9. The system of claim 1, wherein the heat transfer fluid has a boiling point between 500° C. and 800° C.

10. The system of claim 9, wherein the boiling point is at a pressure less than 1 atmosphere.

11. The system of claim 1, wherein the heat transfer fluid comprises at least one of sodium or a sodium-potassium eutectic material.

12. The system of claim 11, wherein the sodium-potassium eutectic material comprises NaK.

13. The system of claim 1, wherein the PCM undergoes a reversible liquid-to-solid phase transition at a temperature between 500° C. and 800° C.

14. The system of claim 13, wherein the PCM comprises at least one of aluminum or an aluminum alloy.

* * * * *